(12) United States Patent
Kuge et al.

(10) Patent No.: US 8,773,126 B2
(45) Date of Patent: Jul. 8, 2014

(54) NUCLEAR MAGNETIC RESONANCE MEASURING METHOD USING AN ISOTOPE-LABELED COMPOUND

(75) Inventors: Katsuaki Kuge, Yokohama (JP);
Kimihiro Yoshimura, Yokohama (JP);
Fumio Yamauchi, Yokohama (JP);
Tetsuya Yano, Tsukuba (JP); Masahiro Shirakawa, Kyoto (JP); Yasuhiro Aoyama, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 798 days.

(21) Appl. No.: 12/676,239

(22) PCT Filed: Sep. 8, 2008

(86) PCT No.: PCT/JP2008/066509
§ 371 (c)(1),
(2), (4) Date: May 25, 2010

(87) PCT Pub. No.: WO2009/031716
PCT Pub. Date: Mar. 12, 2009

(65) Prior Publication Data
US 2010/0225314 A1  Sep. 9, 2010

(30) Foreign Application Priority Data
Sep. 7, 2007  (JP) ................................. 2007-232656

(51) Int. Cl.
*G01V 3/00* (2006.01)
*G01R 33/485* (2006.01)
*G01R 33/46* (2006.01)
*G01R 33/483* (2006.01)
*G01R 33/56* (2006.01)

(52) U.S. Cl.
CPC .......... *G01R 33/485* (2013.01); *G01R 33/4633* (2013.01); *G01R 33/5605* (2013.01); *G01R 33/4833* (2013.01); *G01R 33/5607* (2013.01); *G01R 33/4608* (2013.01)
USPC ....................................................... 324/307

(58) Field of Classification Search
CPC ............... G01R 33/44; G01R 33/4824; G01R 33/3415; G01R 33/32; G01R 33/341; G01R 33/543; G01R 33/5659; G01R 33/28; G01R 33/448; G01R 33/4608; G01R 33/4816; G01R 33/482; G01R 33/56341; G01R 33/34; G01R 33/48; G01R 33/04
USPC .................................................. 324/300–322
See application file for complete search history.

(56) References Cited

U.S. PATENT DOCUMENTS

| | | | |
|---|---|---|---|
| 5,283,525 A | 2/1994 | Lamerichs et al. | 324/307 |
| 6,027,941 A * | 2/2000 | Jarvie et al. | 436/173 |

(Continued)

FOREIGN PATENT DOCUMENTS

| | | |
|---|---|---|
| EP | 478030 | 4/1992 |
| JP | H09-262221 | 10/1997 |

(Continued)

OTHER PUBLICATIONS

L.E. Kay et al., "Three-Dimensional Triple-Resonance NMR Spectroscopy of Isotopically Enriched Proteins", *J. of Mag. Resonance*, vol. 89, p. 496-514 (1990).

(Continued)

*Primary Examiner* — Dixomara Vargas
(74) *Attorney, Agent, or Firm* — Fitzpatrick, Cella, Harper & Scinto

(57) ABSTRACT

The present invention provides a method for measuring nuclear magnetic resonance that employs a compound in which a plurality of nuclei is labeled with isotopes as a probe agent, highly selectively and highly sensitively obtains a nuclear magnetic resonance signal of the above described probe agent, and can attach a spatial positional information to the above described nuclear magnetic resonance signal, and an apparatus therefore.

18 Claims, 18 Drawing Sheets

(56) References Cited

U.S. PATENT DOCUMENTS

| | | | | |
|---|---|---|---|---|
| 6,046,588 | A | | 4/2000 | Watanabe ............... 324/307 |
| 6,147,490 | A | | 11/2000 | Watanabe ............... 324/307 |
| 6,313,631 | B1 | * | 11/2001 | Fiat et al. ............... 324/318 |
| 7,564,243 | B2 | * | 7/2009 | Desvaux et al. ............... 324/308 |
| 8,481,254 | B2 | * | 7/2013 | Yamauchi et al. ............... 435/4 |
| 2007/0252596 | A1 | | 11/2007 | Kuge ............... 324/307 |
| 2008/0061781 | A1 | * | 3/2008 | Servin et al. ............... 324/311 |
| 2013/0288345 | A1 | * | 10/2013 | Yamauchi et al. ............... 435/287.1 |

FOREIGN PATENT DOCUMENTS

| | | |
|---|---|---|
| JP | H10-137214 | 5/1998 |
| JP | H11-089814 | 4/1999 |
| WO | WO 98/57578 | 12/1998 |
| WO | WO 01/73479 | 10/2001 |

OTHER PUBLICATIONS

H. Geen et al., "Band-Selective Excitation for Multidimensional NMR Spectroscopy", *J. of Mag. Resonance*, vol. 87, p. 415-421 (1990).

W. Boucher et al., "Four Dimensional Heteronuclear Triple Resonance NMR Methods for the Assignment of Backbone Nuclei in Proteins", *J. Am Chem. Soc.*, vol. 114, p. 2262-2264 (1992).

A. Bax et al., "Optimized Recording of Heteronuclear Multidimensional NMR Spectra Using Pulsed Field Gradients", *J. of Mag. Resonance*, vol. 99, p. 638-643 (1992).

B.K. John et al., "Improved Proton-Detected Heteronuclear Correlation Using Gradient-Enhanced z and zz Filters", *J. of Mag. Resonance, Series A*, vol. 101, p. 113-117 (1992).

S. Berger et al., "3D H, C, P Correlation: A New Application of 3D NMR Spectroscopy", *Magnetic Resonance in Chemistry*, vol. 31, p. 1021-1023 (1993).

L.E. Kay, "Field Gradient Techniques in NMR Spectroscopy", *Current Opinion in Structural Biology*, vol. 5, p. 674-681 (1995).

E. Squillaci et al., "MR Spectroscopy of Prostate Cancer, Initial Clinical Experience", *J. Exp. Clin. Cancer Res.*, 24, No. 4, pp. 523-530 (2005).

H. Watanabe et al., "Human Brain Glucose Metabolism Mapping Using Multislice 2D $^1$H—$^{13}$C Correlation HSQC Spectroscopy", *Magnetic Resonance in Medicine*, vol. 43, p. 525-533 (2000).

* cited by examiner

PRESATURATION PULSE

USING ONE OF THEM AS SELECTIVE EXCITATION PULSE

BLOOD
(ADMINISTRATION OF 200μg AND DISSECTION AFTER 1 HOUR)

LIVER
(ADMINISTRATION OF 200μg AND DISSECTION AFTER 1 HOUR)

KIDNEY
(ADMINISTRATION OF 200μg AND DISSECTION AFTER 1 HOUR)

CANCER
(ADMINISTRATION OF 200μg AND DISSECTION AFTER 1 HOUR)

NUCLEAR MAGNETIC RESONANCE MEASURING METHOD USING AN ISOTOPE-LABELED COMPOUND

TECHNICAL FIELD

The present invention relates to a method for measuring nuclear magnetic resonance that employs a compound in which a plurality of nuclei is labeled with isotopes as a probe agent, highly selectively and highly sensitively obtains a nuclear magnetic resonance signal of the above described probe agent, and can attach a spatial positional information to the above described nuclear magnetic resonance signal, and to an apparatus therefore.

BACKGROUND ART

An MRI (magnetic resonance imaging) apparatus is an apparatus which can obtain a nuclear magnetic resonance signal and a positional information from an hydrogen atom contained in water or the like in a measurement sample, by arranging the measurement sample in a static magnetic field having high strength (several hundreds millitesla to several tesla), and applying electromagnetic wave pulses of several dozen to several hundreds megahertz to the measurement sample with gradient magnetic field pulses. When a living body is selected as a measurement sample, the MRI apparatus can noninvasively provide a morphological image in the inner part of the living body. The MRI diagnosis apparatus which is used for a human body of the measurement sample has been widely utilized in the clinical field, and the morphological image obtained thereby exerts its strength for a diagnosis.

A hydrogen atom contained in a metabolic substance in the living body has different nuclear magnetic resonance frequencies according to their chemical environments (chemical bond states) respectively, and the difference is observed as a deviation among the resonance frequencies of the nuclear magnetic resonance signals. The deviation is generally referred to as a chemical shift. MRS (Magnetic Resonance Spectroscopy) is a method for directly detecting the metabolic substance in the living body as a nuclear magnetic resonance spectrum generally by using the deviation of the chemical shift, and 1H MRS (1H Magnetic Resonance Spectroscopy) is the MRS which uses a hydrogen-1 as a target. Unlike the morphological image obtained through a typical MRI, 1H MRS can noninvasively detect an endogenous metabolic substance and the positional information as well, if necessary, and accordingly is expected to be also applied to various diagnoses. A study is continued which is directed at evaluating, for instance, a prostatic cancer by measuring a ratio of choline, creatine and citric acid at sites of an object for an examinee through 1HMRS (for instance, see Journal of Experimental & Clinical Cancer Research), 24 (4), 523 (2005)). In addition to the above study, such studies on 1HMRS are performed as to relate to brain tumor, brain infarction, and brain metabolism. Furthermore, 1H MRSI (1H Magnetic Resonance Spectroscopy Imaging) is also known which observes 1H MRS as an imaged figure.

The 1HMRS has the highest sensibility, because the hydrogen-1 having a nuclear spin has a natural isotope abundance ratio of approximately 100% and has a large nuclear gyromagnetic ratio. However, there are many substances containing a hydrogen atom including water in the living body, so that when a specific substance of interest is tried to be observed, a contamination signal from surrounding tissues becomes a problem. The 1HMRS has a narrow band of observed frequency, and often has a peak in which a plurality of peaks is overlapped.

On the other hand, 13CMRS (13C Magnetic Resonance Spectroscopy) is also known which uses a nuclear magnetic resonance signal of a carbon-13 that is an isotope of carbon. The 13CMRS has a wider band of observed chemical shift range than that of 1HMRS, has excellently separated peaks, and can analyze a metabolic substance or the like more in detail. However, the carbon-13 having the nuclear spin has a natural isotope abundance ratio of only about 1.1% in contrast to that of the hydrogen-1, and so that the 13CMRS shows extremely lower signal-to-noise ratio than 1HMRS.

Then, it is effective to observe 13CMRS by combining an isotope-labeled compound of a carbon-13 with a probe agent. A usable probe agent includes, for instance, a glucose which originally exists in the living body and makes its carbon atom isotope-labeled with the carbon-13.

In an MRI imaging operation, an MRI contrast agent or the probe agent is occasionally used. The MRI contrast agent can increase an amount of information for diagnosis by emphasizing a state of blood vessel, a state of vascular flow in an organ, or a state of vascular flow or features of a diseased site on the MRI image. In addition, there is a case in which a disease cannot be found without using the contrast agent. An MRI contrast agent or a probe agent to be mainly employed includes a gadolinium formulation which is prepared by making a gadolinium ion and an organic compound form a complex and stabilizing the complex, or an iron formulation such as an iron oxide fine particle. Because these formulations are paramagnetic, the formulations give an influence on a relaxation time and a chemical shift of the nuclear magnetic resonance signal emitted from a region in which the formulation exists, and give a contrast to the MRI image. However, these formulations do not originally exist in the living body, and need to be largely administered so as to present the contrast. Accordingly, there is a problem that an influence to the living body is feared. In contrast to this, the method of employing a compound which originally exists in the living body and is isotope-labeled with the carbon-13 as the probe agent has an advantage of giving little influence to the living body even when the compound is administered in large quantities to some extent. Furthermore, the method is an effective means for obtaining useful information on a distribution and concentration of the above described probe agent in the living body due to metabolism or the like. The method also can compensate a low degree of sensitivity due to a low natural isotope abundance ratio of the carbon-13.

On the other hand, because a carbon-13 has a nuclear gyromagnetic ratio of only ¼ of the nuclear gyromagnetic ratio of a hydrogen-1, the compound isotope-labeled (label) with the carbon-13 has a problem of showing lower signal-to-noise ratio than 1HMRS even when the compound is used as the probe agent. In order to solve the problem, a method is proposed which improves signal-to-noise ratio by utilizing a magnetization transfer occurring between a hydrogen-1 and a carbon-13. This is a method of irradiating the hydrogen-1 with a radio wave having a frequency resonant with the hydrogen-1 to create high polarization state of the hydrogen-1, then irradiating the carbon-13 with a radio wave having a frequency resonant with the carbon-13 to transfer the high polarization state of the hydrogen-1 to the carbon-13, and observing the nuclear magnetic resonance signal of the carbon-13. This is one of techniques referred to as a double resonance method. Known representative techniques among such methods are INEPT (Insensitive Nuclei Enhanced by Polarization Transfer) and DEPT (Distortionless Enhancement by Polarization Transfer). When (T) is defined as a repetition time of measurement, $\gamma_{1H}$ and $T_{1H}$ are defined as a gyromagnetic ratio of the hydrogen-1 and a longitudinal relaxation time of the hydrogen-1 respectively, and $\gamma_{13C}$ and $T_{13C}$ are defined as a gyromagnetic ratio of the carbon-13 and a longitudinal relaxation time of the carbon-13 respectively, sensitivities of the nuclear magnetic resonance signal of the carbon-13 are different according to an observation method, as follows. Specifically, sensitivity in a case where the carbon-13 is directly observed is $\gamma_{13C}^{5/2} (1-e^{-T/T13C})$. On the other hand, sensitivity in a case where the carbon-13 is observed with the use of the magnetization transfer is $(\gamma_{1H}/\gamma_{13C})^{3/2} (1-e^{-T/T1H})$. Accordingly, the method of using the above described magnetization transfer can show approximately 4 times higher sensitivity in principle.

A method is also known which transfers the high polarization state of a hydrogen-1 to a carbon-13, further transfers the polarization back to the hydrogen-1 and observes the nuclear magnetic resonance signal of the hydrogen-1. Known representative methods of using the magnetization transfers twice as describe above include HSQC (Heteronuclear Single Quantum Coherence) and HMQC (Heteronuclear Multi Quantum Coherence). In a case where the method is employed, the sensitivity becomes $\gamma_{1H}^{5/2} (1-e^{-T/T1H})$. The obtained sensitivity is further higher than the sensitivity in a case where the carbon-13 is observed with the use of the magnetization transfer. Measurement examples of 1H MRS using HSQC and HMQC are reported, which use the magnetization transfers between the hydrogen-1 and the carbon-13 twice (see Magnetic resonance in medicine, 43, 525 (2000), Japanese Patent Application Laid-Open No. H10-137214, Japanese Patent Application Laid-Open No. H09-262221 and Japanese Patent Application Laid-Open No. H11-089814).

The magnetization transfer between nuclei does not occur unless each nucleus to be mutually magnetization-transferred has a nuclear spin. Therefore, when considering the magnetization transfer between a hydrogen atom and a carbon atom, only signal of the hydrogen atom bonded to the carbon-13 is observed, and the nuclear magnetic resonance signal of the hydrogen atom bonded to the carbon-12 is not detected. Accordingly, when the 1H MRS is measured by using the above described HSQC or HMQC technique after having made a living body take a probe agent isotope-labeled with a carbon-13, the nuclear magnetic resonance signal of the hydrogen atom mainly coming from the compound isotope-labeled with the carbon-13 is detected. However, because a carbon-13 exists in nature at a ratio of 1.1%, a substance having a hydrogen atom bonded to a carbon-13 exists in some rate in sites to be observed, other than the probe agent. Accordingly, the nuclear magnetic resonance signal of the hydrogen atom observed from these substances becomes a contamination signal, which becomes a factor of decreasing signal-to-noise ratio.

Furthermore, when a distribution and a concentration of the probe agent isotope-labeled with the carbon-13 in the living body is observed with the above described 1H MRS, the 1H MRS causes a problem of needing to separate a nuclear magnetic resonance signal of a compound in the probe agent from a nuclear magnetic resonance signal of a compound which has the same chemical structure as the compound in the above described probe agent and originally exists in a living body (compound which originally has the carbon-13 at the same position as that of the carbon-13 in the probe agent). In other words, when glucose isotope-labeled with the carbon-13 is used for the probe agent, 1.1% of glucose which originally exists in the living body is observed with the above described 1HMRS, because the glucose contains the carbon-13 at the same position as that of the carbon-13 in the probe agent. Suppose that when the isotope-labeled probe agent has been taken in the living body, the concentration is considerably diluted. Then, the signal coming from 1.1% of the glucose, which originally exists in the living body, is an obstacle in a process of evaluating the distribution and the concentration of the glucose isotope-labeled with the carbon-13.

By the way, a technique with the use of the magnetization transfer occurring between three nuclear spins each having different resonance frequencies is a triple resonance method. The triple resonance method is used mainly for a molecular structure analysis such as protein or peptide, and a HNCA technique, a HN(CO)CA technique and a HNCO technique are known as representative examples. For instance, the HNCA technique (see Journal of Magnetic Resonance, 89,4965 (1990), for instance) transfers magnetization from the hydrogen-1 in an amide bond to a nitrogen-15 bonded thereto, further to a carbon-13 in an alpha position bonded thereto, and further transfers the magnetization back to the hydrogen-1 through the reverse path. By transferring the magnetization in the above described way, the nuclear magnetic resonance signal of the hydrogen-1 which has passed the above described magnetization transfer path is observed in a form of a two-dimensional or a three-dimensional spectrum, and information on a main chain sequence of protein, peptide or the like can be obtained therefrom. In addition, Magnetic. Resonance in. Chemistry, 31, 1,021 (1993) also reports a triple resonance method among a hydrogen-1, a carbon-13 and a phosphorus-31.

A generally known triple resonance method is directed at analyzing information on a molecular structure such as a main chain sequence of protein, peptide or the like. Accordingly, the triple resonance method includes measuring protein, peptide or the like in a form of a solution, thereby observing the information in a form of a two-dimensional or three-dimensional spectrum, and accordingly performing a plurality of chemical shift evolutions across axes of resonance frequencies for three nuclides. Therefore, it is difficult to obtain spatial positional information such as an image of a substance with the generally known triple resonance method. The triple resonance method needs a plurality of chemical shift evolutions across axes of resonance frequencies for three nuclides in order to obtain an image of a substance, and accordingly needs an extremely long period of measurement time when trying to obtain the further spatial image in three axial directions. For the above described reason, the generally known triple resonance method is not suitable for a method of directly measuring the living body itself, and detecting and imaging a metabolic substance or the like.

On the other hand, the triple resonance method used in the present invention is used for selectively detecting the isotope-labeled probe agent, and does not need to perform a plurality of chemical shift evolutions across axes of resonance frequencies for three nuclides. Incidentally, WO 98/57578 discloses a concept on MRI with the use of the triple resonance method, but does not disclose its specific technology.

DISCLOSURE OF THE INVENTION

A conventional MRS method nonselectively observes an activated nuclear magnetic resonance signal. In other words, when a mixture sample containing a plurality of chemical compounds having different chemical structures containing a nuclide to be observed is measured, a superposed signal of nuclear magnetic resonance signals coming from the nuclides to be observed in the respective compounds is consequently observed. Therefore, in a case where the metabolic substance or the like is detected and the distribution and the concentration are going to be observed with the MRS method, the nuclear magnetic resonance signals and spectra transmitted from other compounds having different chemical structures are overlapped, which makes analysis difficult. This problem remarkably occurs in a case where 1HMRS is observed in a research or a diagnosis on metabolism or the like in a living body, a tissue of the living body and a cell of the living body. In the case, a drastic number of contamination signals come from a hydrogen atom of innumerable compounds that exist in the periphery, and cause an obstacle for the analysis.

In order to solve such a problem, it is considered to employ a probe agent in which a compound that originally exists in the living body and gives small influence to the living body is isotope-labeled with a carbon-13 and to observe the 13CMRS. In this case, however, there are problems that contamination signals coming from 1.1% of the carbon-13 contained in plenty of carbon atoms existing in the periphery are a factor of lowering signal-to-noise ratio, and besides, 13CMRS has lower observation sensitivity than 1HMRS.

In addition, even when 1HMRS is observed by using the probe agent isotope-labeled with the carbon-13 for a target and using magnetization transfer (HMQC or HSQC) between a hydrogen-1 and a carbon-13, the contamination signal sent from the hydrogen-1 bonded to the carbon-13 that exists in the periphery (natural abundance ratio of 1.1%) also is a factor of decreasing signal-to-noise ratio. Furthermore, there is a problem of needing to separate a nuclear magnetic resonance signal sent from the probe agent isotope-labeled with the carbon-13, which has been externally taken in, from a nuclear magnetic resonance signal coming from a compound having the same chemical structure as that of a compound which originally exists in the living body and is used in the above described probe agent.

Based on the above description, an object of the present invention is to provide a suitable method for observing a behavior, a distribution and a concentration of a probe agent containing a compound that exists in the living body and is labeled with an isotope, in the living body, which are caused by metabolism or the like, with the use of MRS, by introducing the above described probe agent externally into a sample of a living body in which a plurality of compounds exists, and thereby reducing an influence onto the living body.

In addition, another object of the invention is to provide a suitable method for selectively observing a nuclear magnetic resonance signal coming from the above described probe agent at a high signal-to-noise ratio, by decreasing a contamination signal from the periphery and by separating a nuclear magnetic resonance signal sent from a compound in the probe agent from a nuclear magnetic resonance signal sent from a compound which has the same chemical structure as that of the compound in the probe agent and is not labeled with an isotope, in an observation method of using the above described probe agent and MRS.

Further another object of the invention is to provide a suitable method for obtaining spatial positional information of the probe agent in the living body, which is observed with MRI by being introduced into the living body sample and is formed from an isotope-labeled compound.

The present invention is a nuclear magnetic resonance signal measuring method which aims a compound containing a nucleus capable of transmitting a nuclear magnetic resonance signal, as a measurement target, characterized in that the method selects an isotope-labeled compound as the measurement target, in which at least two nuclei which can transmit nuclear magnetic resonance signals, have each different nuclear magnetic resonance frequency and are bonded to each other are isotope-labeled at a higher ratio than a natural isotope abundance ratio; has a process for selectively observing the nuclear magnetic resonance signal and positional information of a first nucleus contained in the isotope-labeled compound by using a pulse sequence having a unit of observing the nuclear magnetic resonance signal of the first nucleus contained in the isotope-labeled compound, which has passed magnetization transfer from the first nucleus to a second nucleus, magnetization transfer from the second nucleus to a third nucleus, magnetization transfer from the third nucleus to the second nucleus, and magnetization transfer from the second nucleus to the first nucleus, between three nuclei which include at least two nuclei that are contained in the isotope-labeled compound existing in a measurement sample, are isotope-labeled and are bonded to each other, can transmit nuclear magnetic resonance signals, have different nuclear magnetic resonance frequencies from each other and are bonded to each other, and a unit of adding positional information to the nuclear magnetic resonance signal of the first nucleus contained in the isotope-labeled compound; and thereby decreases a nuclear magnetic resonance signal of a nuclide of the same type as the first nucleus contained in a compound which is not labeled with an isotope, and selectively observes a nuclear magnetic resonance signal of the first nucleus contained in the isotope-labeled compound.

The measuring method according to the present invention can highly selectively observe a dynamic state of a probe agent in a living body by using MRS. In other words, the measuring method according to the present invention shows an effect of enabling MRS to be measured at a high signal-to-noise ratio, by reducing a contamination signal transmitted during MRS measurement. Furthermore, the measuring method can additionally provide spatial positional information which is important in MRS.

Further features of the present invention will become apparent from the following description of exemplary embodiments with reference to the attached drawings.

BEST MODE FOR CARRYING OUT THE INVENTION

Figure 1:
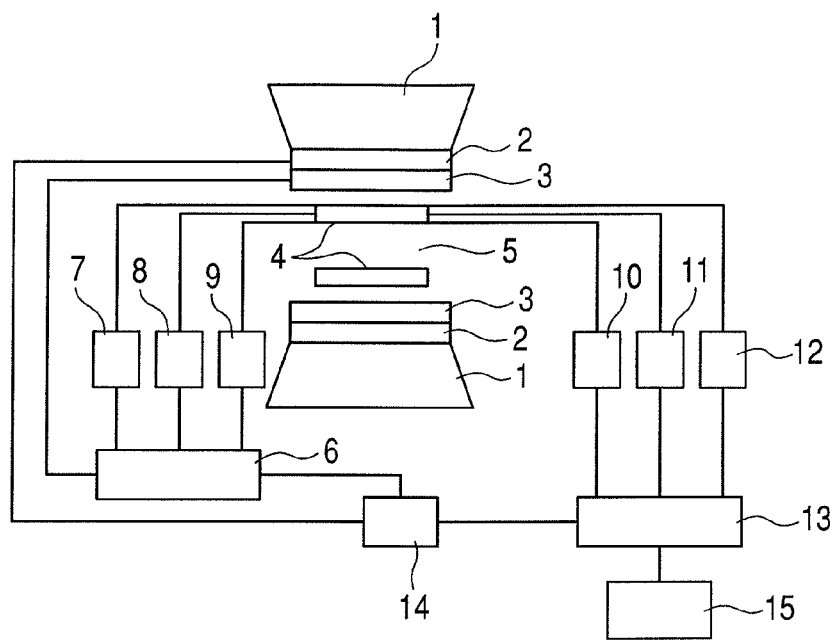
FIG. 1 is a schematic view illustrating one example of a configuration of a nuclear magnetic resonance apparatus suitable for carrying out the present invention.

Nucleus Capable of Transmitting Nuclear Magnetic Resonance Signal

"Nucleus capable of transmitting nuclear magnetic resonance signal" is an atomic nucleus (nucleus) that has a spin number except zero and generates a nuclear magnetic resonance signal by being excited by an electromagnetic wave having resonance frequency. Specific examples for such a nucleus include the following nuclei. For instance, a hydrogen-1 ($^1$H), a fluorine-19 ($^{19}$F), a carbon-13 ($^{13}$C) and a phosphorus-31 ($^{31}$P) have the spin number of ½. In addition, a nitrogen-14 ($^{14}$N) and a hydrogen-2 ($^2$H) have the spin number of 1, and a boron-11 ($^{11}$Br) and a chlorine-35 ($^{35}$Cl) have the spin number of 3/2. Any of the nuclei can transmit a nuclear magnetic resonance signal.

"To selectively observe a nuclear magnetic resonance signal of a compound of a target to be observed" is to observe a nuclear magnetic resonance signal of a compound of a measurement target while inhibiting the signal from overlapping with a nuclear magnetic resonance signal of another compound, under a measurement environment containing a compound which includes an observation nuclide (nucleus which is desired to generate a nuclear magnetic resonance signal in measurement or nucleus having atomic number and mass number equal to those of nucleus which is desired to be a path of magnetization transfer) and has a different chemical structure from that of a compound of a measurement target.

(Nuclear Magnetic Resonance Detecting Method)

The present invention provides a method for selectively measuring a nuclear magnetic resonance signal, which can observe the nuclear magnetic resonance signal of the observation nuclide contained in a compound of a measurement target, while decreasing the nuclear magnetic resonance signal of the observation nuclide in a compound other than the compound of the measurement target, in a mixture sample containing a compound that includes the observation nuclide and has a different chemical structure from the compound of the measurement target.

A nuclear magnetic resonance signal measuring method according to the present embodiment has at least the following (step 1) and (step 2).

(Step 1)

A step of employing an isotope-labeled compound as a measurement target, in which at least two nuclei which can transmit nuclear magnetic resonance signals, have each different nuclear magnetic resonance frequency and are bonded to each other are isotope-labeled at a higher ratio than a natural isotope abundance ratio, and adding the above described isotope-labeled compound to a measurement sample.

(Step 2)

A step of observing a nuclear magnetic resonance signal of the above described first nucleus contained in the above described isotope-labeled compound in the measurement sample, by using a pulse sequence which can observe a nuclear magnetic resonance signal that passes magnetization transfer from a first nucleus to a second nucleus, magnetization transfer from the second nucleus to a third nucleus, magnetization transfer from the third nucleus to the second nucleus and magnetization transfer from the second nucleus to the first nucleus, which are based on a spin-spin bond between three nuclei which include at least two nuclei that are contained in the isotope-labeled compound added into the measurement sample in the step 1, and are isotope-labeled, can transmit nuclear magnetic resonance signals and have different nuclear magnetic resonance frequencies from each other and are bonded to each other.

In addition, the two nuclei which are isotope-labeled at a higher ratio than the natural isotope abundance ratio in the isotope-labeled compound in the (step 1) can be each independently selected from any one of a carbon-13, a nitrogen-15, an oxygen-17 and a sulphur-33. A measurement sample to which the isotope-labeled compound is added includes a living body, a living tissue and a living cell. A substance existing in the living body (substance in the living body) can be selected as a compound to be an object to be isotope-labeled, and then the compound can decrease a load to the living body because the isotope-labeled compound has the same chemical structure as the substance in the living body.

In addition, a nucleus of which the nuclear magnetic resonance signal is observed is considered as a first nucleus, in the (step 2). Then, magnetization is transferred through sequential paths from the first nucleus to a second nucleus bonded to the first nucleus, from the second nucleus to a third nucleus bonded to the second nucleus, from the third nucleus to the second nucleus, and from the second nucleus to the first nucleus, and a pulse sequence for observing the nuclear magnetic resonance signal of the first nucleus is given to the measurement sample. The first nucleus in this triple resonance method can be selected from any one of a hydrogen-1, a fluorine-19 and a phosphorus-31. The second nucleus and the third nucleus can be each independently selected from any one of a carbon-13, a nitrogen-15, an oxygen-17 and a sulphur-33.

In the (step 2), one mode of pulse sequences for carrying out magnetization transfer can be a form of carrying out magnetization transfer between the first nucleus and the second nucleus in a single quantum coherent state and carrying out magnetization transfer between the second nucleus and the third nucleus in a multi-quantum coherent state. Furthermore, another mode of pulse sequences for carrying out magnetization transfer can be a form of carrying out magnetization transfer between the first nucleus and the second nucleus in a single quantum coherent state and carrying out magnetization transfer between the second nucleus and the third nucleus in a single quantum coherent state.

The (step 2) can further include a step of obtaining positional information of the nuclear magnetic resonance signal of the first nucleus contained in the above described isotope-labeled compound in the measurement sample, by applying a gradient magnetic field pulse relating to an x-axis, a y-axis and a z-axis. By doing this, positional information of the isotope-labeled compound in the living body can be obtained. Specifically, an image-forming method by a nuclear magnetic resonance method such as MRI can be applied to such a method for obtaining the positional information.

The mode will now be summarized below which uses an organic compound in which a plurality of nuclei bonded to each other is isotope-labeled as a probe agent, and selectively detects a nuclear magnetic resonance signal sent from the above described probe agent with a triple resonance method.

At first, a compound of which the behavior in the living body is desired to be observed through MRI is labeled with an isotope, and is determined to be used as a probe agent. This probe agent employs an organic compound in which a plurality of nuclei bonded to each other is labeled with an isotope. In this probe agent, the number of nuclei to be labeled with the isotope may be two, three or more, as long as the number is two or more. The nucleus to be labeled with an isotope is not particularly limited as long as the isotope has a nuclear spin. The nuclide can have a low ratio of natural isotope abundance and a nuclear spin of ½. When it is considered that the probe agent is an organic compound, a carbon-13 and a nitrogen-15 are effective. The above described probe agent is not particularly limited, but can employ an isotope-labeled compound of an organic compound which originally exists in the living body, such as various metabolic substances, saccharides, amino acids and peptides, and can employ an isotope-labeled compound of a metabolic substance particularly among them. By using the isotope-labeled compound of the organic compound which originally exists in the living body, a harmful effect to the living body of a measurement target can be decreased.

In the above described probe agent, a plurality of nuclei bonded to each other is labeled with each isotope, but each nuclide may be different or the same. However, when a plurality of the same nuclides is labeled with an isotope, each nuclear magnetic resonance signal of each nucleus labeled with the isotope can show different chemical shifts from each other.

A nucleus to be observed when the above described probe is observed with the use of the triple resonance method is a first nucleus of which the magnetization is firstly inclined with the use of a radiofrequency pulse. The above described first nucleus is not particularly limited as long as the nucleus has a nuclear spin, but can be a nuclide which has a high ratio of natural isotope abundance and a high nuclear gyromagnetic ratio so that the nuclear magnetic resonance signal of the above described probe can be detected with high sensitivity. The first nucleus can be specifically a hydrogen-1, a fluorine-19 or a phosphorus-31, and can be the hydrogen-1 and the fluorine-19 in particular.

At least one of the hydrogen-1, the fluorine-19 and the phosphorus-31 can be bonded to any one of isotope-labeled nuclei in the above described probe agent.

Subsequently, a measurement sample is prepared which is a living body, a living tissue, a living cell or the like which is appropriately given the above described probe agent and has taken it in.

Thus prepared measurement sample is placed in a nuclear magnetic resonance apparatus, and the apparatus detects the nuclear magnetic resonance signal of the above described probe agent with high selectivity, and observes the behavior of the above described probe agent in the living body.

FIG. 1 illustrates a schematic view showing an example of a configuration of the above described nuclear magnetic resonance apparatus to be used for carrying out the present invention. In FIG. 1, a magnet 1 is a device for applying a static magnetic field to a measurement sample, which is necessary for obtaining a nuclear magnetic resonance signal from the measurement sample. A shim coil 2 and a gradient magnetic field coil 3 are arranged in the inside of the magnet 1 (side of measurement sample). The shim coil 2 adjusts the static magnetic field so that a uniform static magnetic field is applied to the measurement sample. The gradient magnetic field coil 3 is directed at applying a gradient magnetic field having a linear distribution of the gradient magnetic field in three directions in total of a direction of a static magnetic field (z-axis) and two directions perpendicular to the direction of the static magnetic field and also perpendicular to each other (x-axis and y-axis).

A coil 4 for transmitting and receiving radiofrequency pulses corresponding to resonance frequencies of a first nucleus, a second nucleus and a third nucleus is arranged in the further inside. The measurement sample is arranged in a sample space 5. The coil 4 may have a structure in which a transmission coil and a reception coil are separated, or a structure in which one coil serves both as a transmission use and a reception use. In addition, the coil 4 may also be a surface coil type which is arranged at a position close to the measurement sample. The coil 4 may also be a multicoil type in which a plurality of coils is arranged. A radiofrequency-transmitting section 7 for the first nucleus, a radiofrequency-transmitting section 8 for the second nucleus and a radiofrequency-transmitting section 9 for the third nucleus generate radiofrequency pulses corresponding to respective resonance frequencies of the first nucleus, the second nucleus and the third nucleus, and transmit the radiofrequency pulses to the coil 4. An observed nuclear magnetic resonance signal of the first nucleus is received and detected in a signal-collecting section 13 through the coil 4 via a signal-receiving section 10 for the first nucleus, a signal-receiving section 11 for the second nucleus and a signal-receiving section 12 for the third nucleus, is subjected to an analog-to-digital signal conversion process, is sent to a data-processing section 15, and is finally subjected to Fourier transform and the like. In this way, a morphological image, an imaging picture and a spectral data can be obtained. In FIG. 1, reference numeral 6 is a section for controlling sequence and reference numeral 14 is a section for controlling apparatus.

By using such an apparatus, MRS or MRSI is measured on a measurement target arranged in the above described nuclear magnetic resonance apparatus with a triple resonance method. Specifically, at first, a nuclear spin magnetization of a first nucleus is excited by the radiofrequency pulse. The nucleus of which the nuclear magnetic resonance signal is observed is the above described first nucleus. Then, a radiofrequency pulse is applied to the sample to make the magnetization polarization which has been generated in the above described first nucleus transfer to a second nucleus. Furthermore, a radiofrequency pulse is applied to the sample to make the magnetization polarization which has been transferred to the above described second nucleus transfer to a third nucleus. By adversely performing a similar process, the magnetization polarization is transferred from the third nucleus to the second nucleus and further from the second nucleus to the first nucleus, and a nuclear magnetic resonance signal associated with the first nucleus is obtained.

Chemical shift information of the second nucleus and the third nucleus are added to the nuclear magnetic resonance signal of the first nucleus, which has been obtained after the operation of making the magnetization transfer pass through the above described path. The magnetization transfer can occur only between each nucleus having a nuclear spin, so that the nuclear magnetic resonance signal of the first nucleus contained in a compound containing a nucleus which cannot cause the magnetization transfer (Nucleus which does not have a nuclear spin. For instance, a carbon 12.) in the second nucleus or the third nucleus is not observed.

For instance, when a probe agent having a bond of a hydrogen atom—a carbon atom—a nitrogen atom is a target to be observed, the first nucleus is a hydrogen-1 and is a nucleus to be observed. The second nucleus is a carbon-13, and the third nucleus is a nitrogen-15. In other words, in this probe agent, a nucleus to be labeled with an isotope is a carbon atom and a nitrogen atom which are bonded to each other.

On the other hand, a probe agent having a bond of a hydrogen atom—a carbon atom—a carbon atom may also be used. In this case, the first nucleus is the hydrogen-1 and a nucleus to be observed. In addition, both of the second nucleus and the third nucleus are the carbon-13. In other words, in this probe agent, nuclei to be labeled with an isotope are two carbon atoms bonded to each other. In this case, however, the two carbons-13 labeled with an isotope can have different resonance frequencies (chemical shift values) from each other, and can be excited by radiofrequency pulses having different frequencies from each other.

In the following description, a probe agent having the bond of a hydrogen atom—a carbon atom—a nitrogen atom will be taken as an example. It is needless to say that the nuclides having the above described combination will be taken as the example in consideration of ease of description, but the type and the combination are not limited, as long as the nuclides can transmit a nuclear magnetic resonance signal and a first nucleus, a second nucleus and a third nucleus can transmit different nuclear resonance frequencies from each other.

Approximately 100% by a ratio of hydrogen atoms are hydrogen-1, and are nuclides having the nuclear spin of ½. On the other hand, stable isotopes of the carbon atom are a carbon-12 and a carbon-13, and the carbon-13 is a nuclide having the nuclear spin of ½ (where natural isotope abundance ratio of the carbon-13 is 1.07%). Stable isotopes of the nitrogen atom are a nitrogen-14 and a nitrogen-15, and the nitrogen-15 is a nuclide having the nuclear spin of ½ (where natural isotope abundance ratio of nitrogen-15 is 0.364%). Accordingly, among compounds having one bond of a hydrogen atom—a carbon atom—a nitrogen atom, a compound having a bond of the hydrogen-1—the carbon-13—the nitrogen-15 has a natural abundance ratio only of 0.00389% (1.07%×0.364%). A nuclear magnetic resonance signal of the hydrogen-1 contained only in a small amount of the compound is observed with a triple resonance method.

On the other hand, in the probe agent used in the present example, the carbon atom and the nitrogen atom bonded to each other are respectively isotope-labeled with the carbon-13 and the nitrogen-15. Accordingly, almost all of the bonds of the hydrogen atom—the carbon atom—the nitrogen atom included in the probe agent are the bond of the hydrogen-1× the carbon-13—the nitrogen-15.

Accordingly, when the above described probe agent is given to the measurement sample, and the nuclear magnetic resonance signal of the above described probe agent is observed with the use of the triple resonance method, a contamination signal of the hydrogen-1 contained in a compound other than a measurement target which originally exists in the measurement sample is decreased, and the 1HMRS of the above described probe agent is observed with high selectivity.

Figure 2:
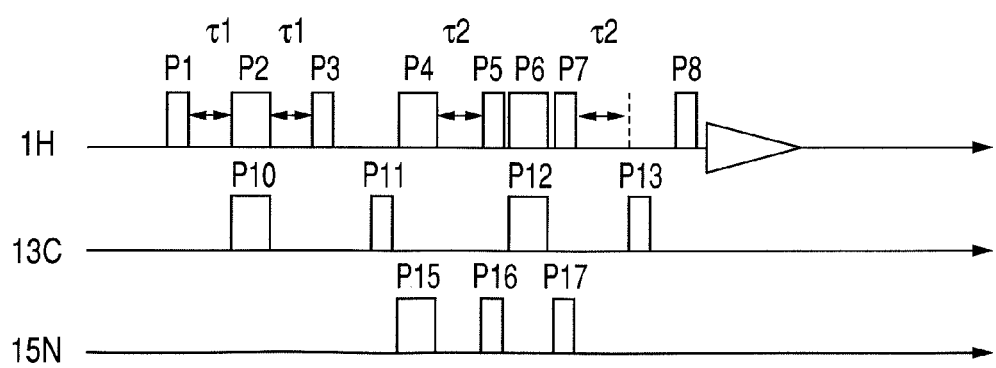
FIG. 2 is a view illustrating one example of a pulse sequence of a triple resonance method with the use of a single quantum coherent and multi-quantum coherent state in the embodiment according to the present invention.

FIG. 2 illustrates an example of a pulse sequence in a triple resonance method to be used in the present invention. In addition, a phase cycling is omitted. Squares having a short lateral side (P1, P3, P5, P7, P8, P11, P13, P16 and P17) show a 90 degrees pulse, and squares having a long lateral side (P2, P4, P6, P10, P12 and P15) show a 180 degrees pulse. At first, a hydrogen-1 is irradiated with a 90 degrees pulse (P1) to generate transverse magnetization −Hy in the hydrogen-1. Subsequently, after the waiting time of τ1, the hydrogen-1 is irradiated with a 180 degrees pulse (P2) and a carbon-13 is irradiated with a 180 degrees pulse (P10), and then the waiting time of τ1 is taken. By doing this, a chemical shift is refocused, and the coupling of the hydrogen-1 and the carbon-13 evolves for a period of time of 2×τ1. When a coupling constant between the hydrogen-1 and the carbon-13 is defined as $J_{HC}$, the magnetization becomes $\cos(\pi J_{HC} 2\tau 1)$ Hy−$\sin(\pi J_{HC} 2\tau 1)$ 2HxCz. Here, when τ1 is set at $\frac{1}{4}J_{HC}$ seconds, for instance, the y magnetization of the hydrogen-1 becomes zero and the anti-phase x magnetization of the hydrogen-1 becomes −2HxCz to be optimized. Immediately after the optimization, the hydrogen-1 is irradiated with a 90 degrees pulse (P3), and then a longitudinal 2 spin order state 2 HzCz is generated. This state does not evolve with time, so that the carbon-13 is irradiated with a 90 degrees pulse (P11). Then, an anti-phase y magnetization −2 HzCy of the carbon-13 is generated, and thereby the first magnetization is transferred from the hydrogen-1 to the carbon-13 in a single quantum coherent state. Here, P3 and P11 may also be emitted at the same time. After the carbon-13 has been irradiated with P11, the hydrogen-1 and a nitrogen-15 are irradiated with 180 degrees pulses (P4 and P15). Then, the evolution due to coupling is refocused, and the chemical shift of the carbon-13 evolves. After irradiation with P4 and P15, the waiting time of τ2 is taken. During the time of τ2, coupling between the carbon-13 and the nitrogen-15 evolves, and a term of double anti-phase magnetization 4 HzCxNz of the carbon-13 is produced. After the time of τ2 has elapsed, the hydrogen-1 and the nitrogen-15 are irradiated with 90 degrees pulses (P5 and P16). Thereby, the magnetization is transferred from the carbon-13 to the nitrogen-15 in a multi-quantum coherent state. Specifically, the multi-quantum coherent state of three spins 4HyCxNy is produced. Here, when a coupling constant between the carbon-13 and the nitrogen-15 is defined as $J_{CN}$, and the waiting time τ2 is set at $\frac{1}{2}J_{CN}$ seconds, magnetization 4HyCxNy in the multi-quantum coherent state of three spins is optimized. After irradiation with P16, the hydrogen-1 and the carbon-13 are irradiated with 180 degrees pulses (P6 and P12). During the irradiation, evolution due to coupling is refocused, and the chemical shift of the nitrogen-15 evolves. It is a feature of the triple resonance method according to the present example that a waiting time after irradiation with P16 and before irradiation with P6 and P12 can be shortened. Furthermore, a waiting time after irradiation with P6 and P12 and before the hydrogen-1 and the nitrogen-15 are irradiated with 90 degrees pulses (P7 and P17) can be shortened. Thereby, the pulse sequence can be shortened. When the hydrogen-1 and the nitrogen-15 are irradiated with P7 and P17, the state is returned to the double anti-phase magnetization 4 HzCxNz of the carbon-13 again. Here, the waiting time of τ2 is set and the state is refocused to the anti-phase transverse magnetization 2 HzCy of the carbon-13. After the time of τ2 has elapsed, the carbon-13 is irradiated with a 90 degrees pulse (P13), and the longitudinal 2 spin order 2 HzCz is produced again. This state does not evolve with the time, the hydrogen-1 can be irradiated with a 90 degrees pulse (P8) after a fixed period of time after the irradiation with P13, or the hydrogen-1 and the carbon-13 may also be irradiated with the P13 and the P8 at the same time. Subsequently, the hydrogen-1 is irradiated with the 90 degrees pulse (P8), and the anti-phase y magnetization 2HyCz of the hydrogen-1 is produced. In this state, the nuclear magnetic resonance signal of the hydrogen-1 can be immediately taken in. However, when the signal is immediately taken in, the nuclear magnetic resonance signal of the hydrogen-1 is detected as a doublet of a anti-phase.

By the way, in the pulse sequence of FIG. 2, when chemical shifts of $^{13}$C and $^{15}$N dose not evolve, the 180 degrees pulses of P4, P15, P6 and P12 are unnecessary. The point is similar in pulse sequences (each sequence in FIG. 3, FIG. 4, FIG. 8, FIG. 9, FIG. 10 and FIG. 11), which are modified examples of FIG. 2 and will be described later.

Figure 3:
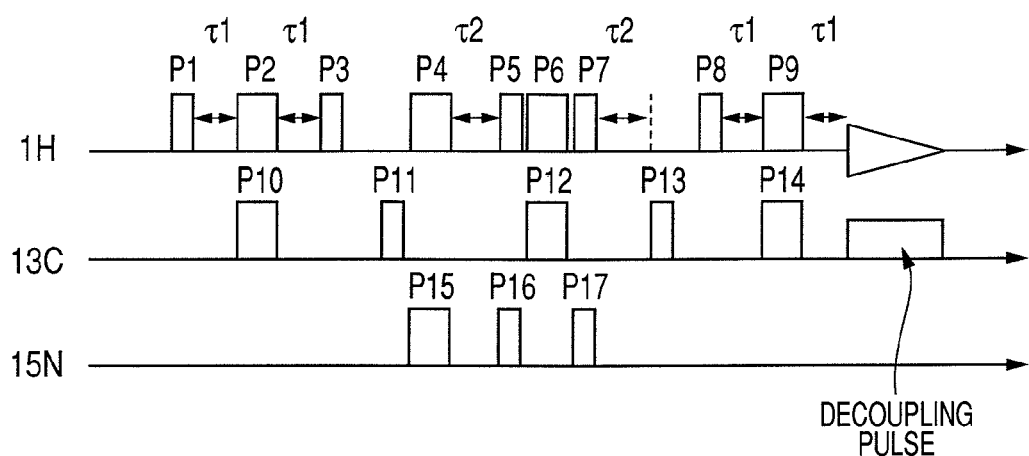
FIG. 3 is a view illustrating one example of a pulse sequence when decoupling is performed in a pulse sequence of FIG. 2.

On the other hand, the hydrogen-1 and the carbon-13 can also be irradiated with 180 degrees pulses (P9 and P14) after the waiting time of τ1 has elapsed after irradiation with P8, as is illustrated in FIG. 3. When the hydrogen-1 and the carbon-13 have been irradiated with P9 and P14, the nuclear magnetic resonance signal of the hydrogen-1 can be detected in the form of in-phase magnetization Hx, after the waiting time of τ1 has been taken. By converting the anti-phase y magnetization 2HyCz of the hydrogen-1 to the in-phase magnetization Hx of the hydrogen-1, a decoupling pulse can be applied to the carbon-13 when the nuclear magnetic resonance signal of the hydrogen-1 is taken in. Thereby, coupling between the hydrogen-1 and the carbon-13 is cancelled, so that 1HMRS with a higher signal-to-noise ratio can be measured.

In the pulse sequences illustrated in FIG. 2 and FIG. 3, the magnetization is transferred between the hydrogen-1 and the carbon-13 in the single quantum coherent state, and is transferred between the carbon-13 and the nitrogen-15 in the multi-quantum coherent state.

In 1HMRS, when a great deal of water exists in a measurement target, it is necessary to eliminate or control a nuclear magnetic resonance signal of the hydrogen-1 in water. Generally, there is a method to control a water signal by selectively exciting a spin of the hydrogen-1 in water with the use of a presaturation pulse or a CHESS (chemical shift selection) pulse, and sufficiently dephasing the magnetization with the use of a gradient magnetic field pulse. However, the method is not particularly limited, but a method of using a pulse which excites a substance other than water or a method of eliminating the water signal by coherence selection with the use of the gradient pulse may be used.

Figure 4:
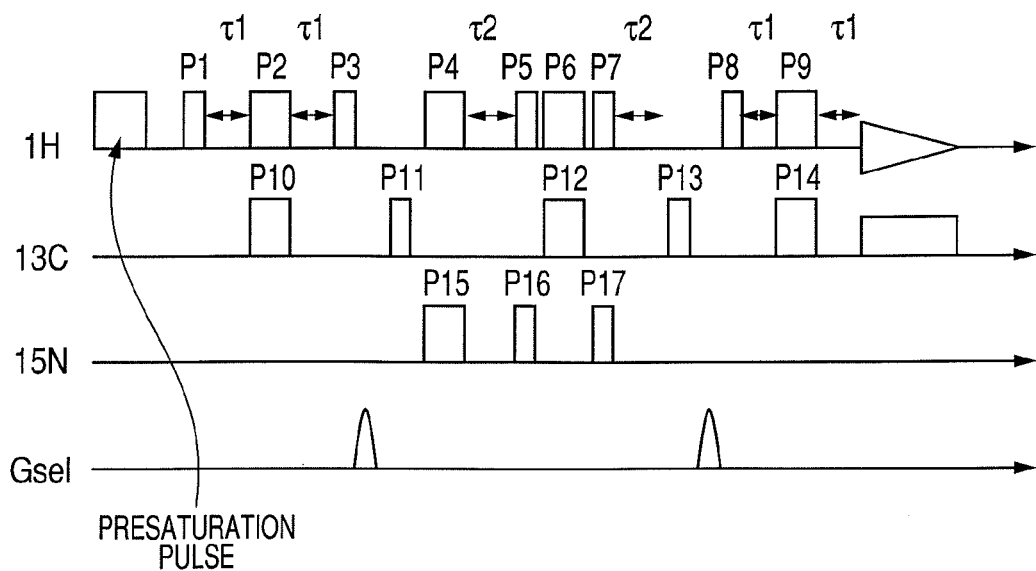
FIG. 4 is a view illustrating one example of a pulse sequence which has a presaturation pulse for cancelling a water signal and a gradient magnetic field pulse inserted into a pulse sequence of FIG. 3.

FIG. 4 illustrates an example of a pulse sequence for eliminating the water signal by inserting the presaturation pulse and the gradient magnetic field pulse into the pulse sequence of FIG. 3.

Figure 5:
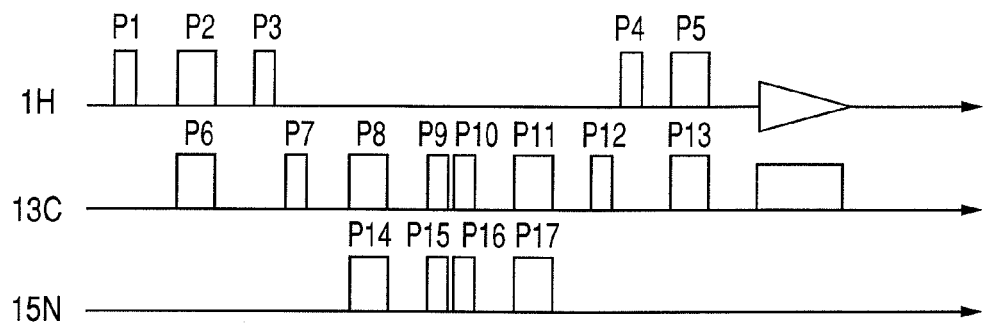
FIG. 5 is a view illustrating one example of a pulse sequence of a triple resonance method with the use of a single quantum coherent state in the embodiment according to the present invention.

Next, FIG. 5 illustrates a pulse sequence of a triple resonance method, which uses an INEPT technique for transferring magnetization from the hydrogen-1 to the carbon-13 and from the carbon-13 to the nitrogen-15, through a single quantum coherent state. In this pulse sequence, both the magnetization transfer between the hydrogen-1 and the carbon-13 and the magnetization transfer between the carbon-13 and the nitrogen-15 are performed in the single quantum coherent state. In the sequence, when a coupling constant between the hydrogen-1 and the carbon-13 is defined as $J_{HC}$, and τ1 is set at $\frac{1}{4}J_{HC}$ seconds, for instance, the magnetization is optimized. In addition, when a coupling constant between the carbon-13 and the nitrogen-15 is defined as $J_{CN}$, and τ2 is set at $\frac{1}{4}J_{CN}$ seconds, for instance, the magnetization is optimized.

Figure 6:
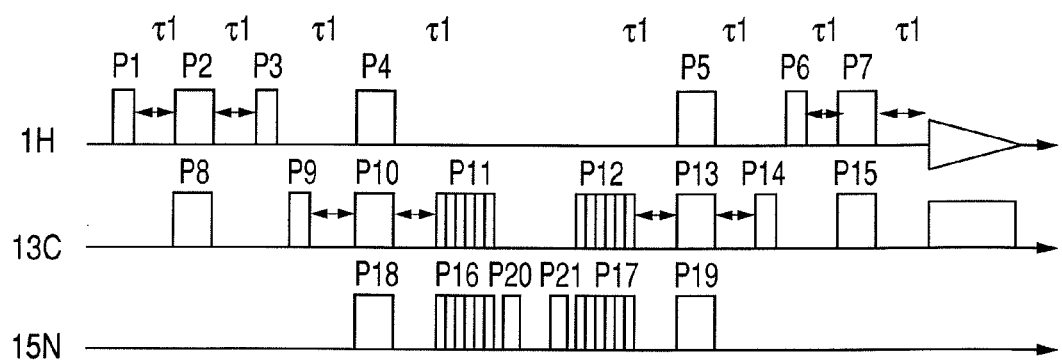
FIG. 6 is a view illustrating one example of a pulse sequence of a triple resonance method with the use of cross polarization in the embodiment according to the present invention.

As is shown in the pulse sequence illustrated in FIG. 6, the cross polarization can also be used for the magnetization transfer from the carbon-13 to the nitrogen-15.

In this case, spinlock pulses (P11, P12, P16 and P17) are used for transferring the magnetization. A continuous wave pulse, for instance, may be used for the spinlock pulse, or the magnetization can be transferred by using a composite pulse such as WALTS and MLEV and optimizing a Hartman-Hahn condition. In the sequence, when a coupling constant between the hydrogen-1 and the carbon-13 is defined as $J_{HC}$, and $\tau 1$ is set at $\frac{1}{4}J_{HC}$ seconds, for instance, the magnetization is optimized.

Figure 7:
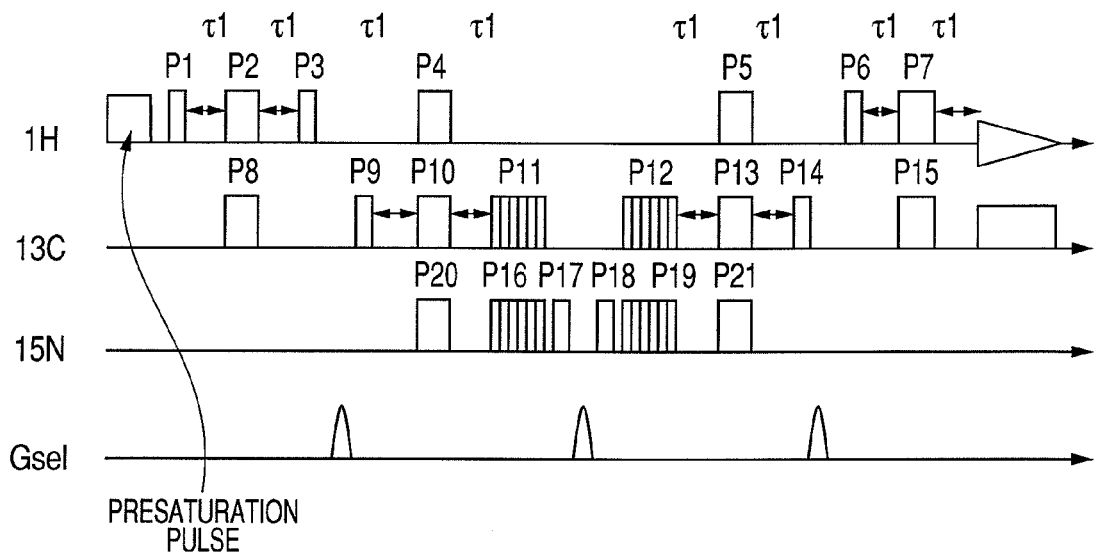
FIG. 7 is a view illustrating one example of a pulse sequence which has a presaturation pulse for cancelling a water signal, a gradient magnetic field pulse and a zz filter inserted into a pulse sequence of FIG. 6.

Furthermore, in order to obtain selectivity, it is also possible to insert a gradient magnetic field pulse in between P17 and P18, as is illustrated in FIG. 7. The above sequence returns a transverse magnetization of the nitrogen-15 to a longitudinal magnetization by the first 90 degrees pulse (P17), spoils an unnecessary nuclear magnetic resonance signal by the gradient magnetic field pulse, and recovers the transverse magnetization of the nitrogen-15 by further using the second 90 degrees pulse (P18). Furthermore, it is possible to further reduce the unnecessary nuclear magnetic resonance signal, for instance, by adding a pulse for eliminating a water signal as well.

Figure 8:
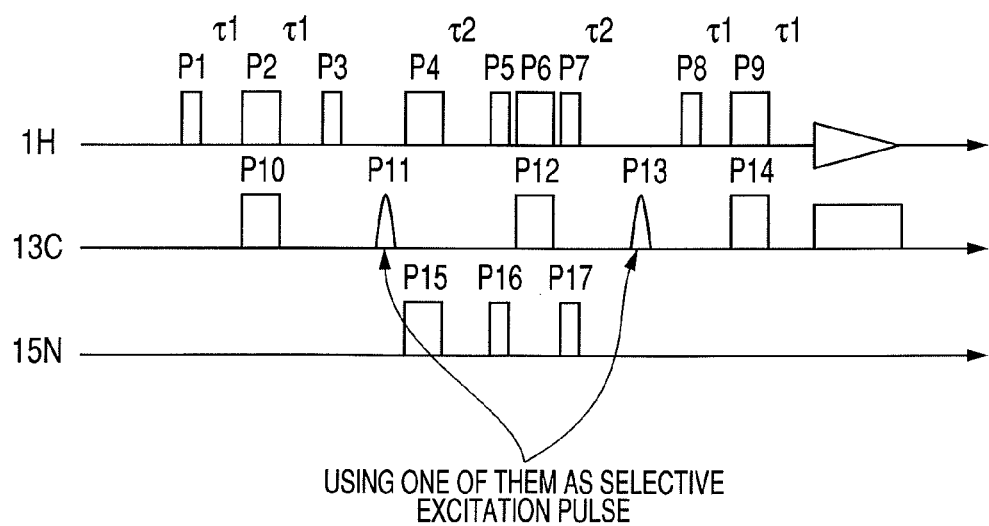
FIG. 8 is a view illustrating one example of a pulse sequence which employs a selective excitation pulse for exciting a carbon-13 in a pulse sequence of FIG. 3.

An excitation pulse of the carbon-13 can also be replaced with a selective excitation pulse. FIG. 8 illustrates an example of such a pulse sequence. The present example is a modified example of the pulse sequence illustrated in FIG. 3. A method according to the present example includes previously measuring a chemical shift value of the carbon-13 in the isotope-labeled probe agent which is desired to be selectively observed, and using a selective excitation pulse for selectively exciting the chemical shift value (resonance frequency) of the carbon-13 in the above described probe agent as a 90 degrees pulse for the carbon-13 (P11, P13 or both of them). The selective excitation pulse can also be used for a 180 degrees pulse, though not being shown. By doing this, only the nuclear spin of the carbon-13 in the isotope-labeled probe agent can be excited, so that the nuclear magnetic resonance signal of the hydrogen-1 in the isotope-labeled probe agent can be further selectively acquired. Such a replacement is also possible in other pulse sequences as well.

Similarly, an excitation pulse of the nitrogen-15 can also be replaced with the selective excitation pulse.

Figure 9:
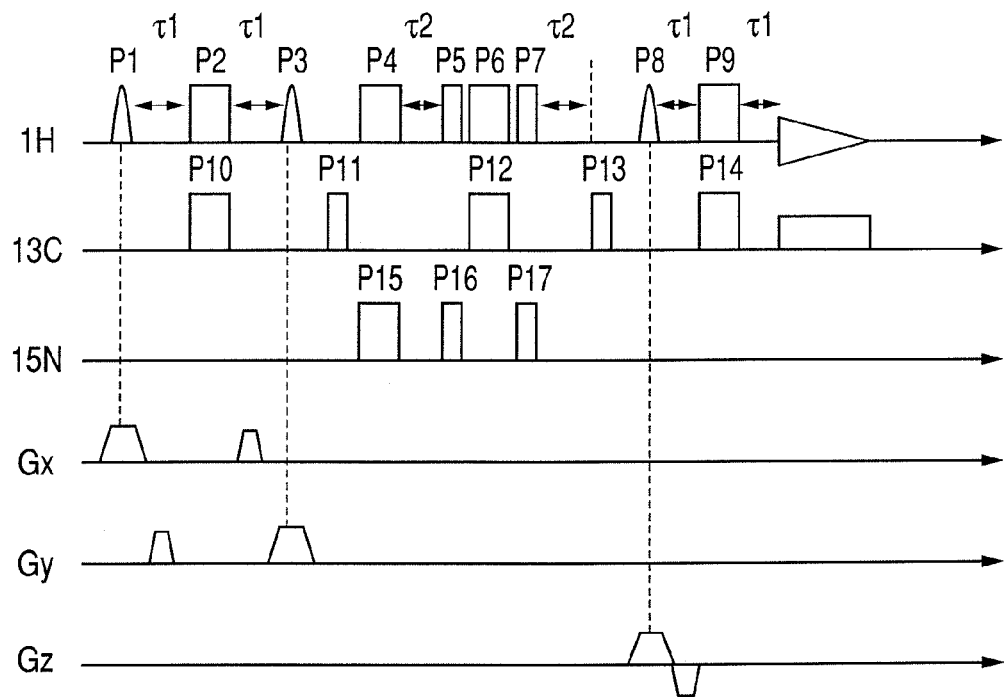
FIG. 9 is a view illustrating one example of a pulse sequence for adding spatial positional information in a tri-axial direction to a nuclear magnetic resonance signal to be observed, in a pulse sequence with the use of a triple resonance method according to the embodiment of the present invention.
Figure 10:
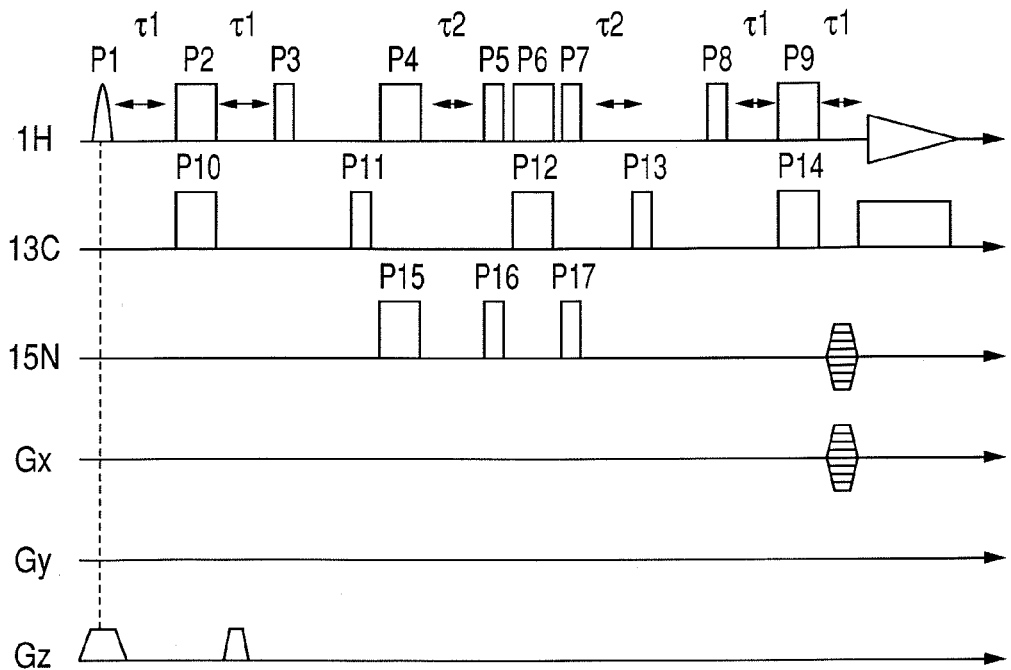
FIG. 10 is a view illustrating one example of a pulse sequence for imaging a substance with the use of slice selection and phase encoding in a pulse sequence of a triple resonance method according to the embodiment of the present invention.
Figure 11:
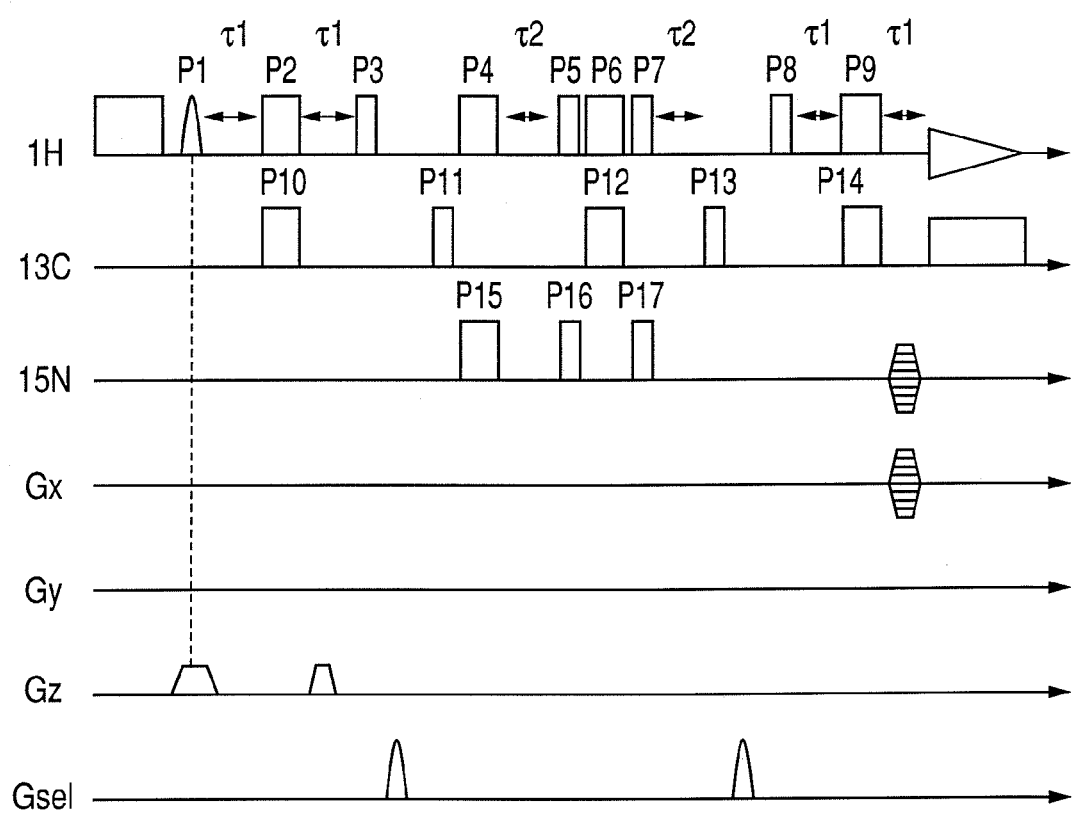
FIG. 11 is a view illustrating one example of a pulse sequence which has a presaturation pulse for cancelling a water signal and a gradient magnetic field pulse inserted into a pulse sequence of FIG. 10.

FIG. 9 illustrates one example of the pulse sequence for adding triaxial positional information to an MRS data to be obtained through a triple resonance method, in the triple resonance method. The present example is a modified example of the pulse sequence illustrated in FIG. 3. Specifically, in the pulse sequence of FIG. 3, for instance, radiofrequency pulses of a P1 pulse, a P3 pulse and a P8 pulse are applied as respective slice selection pulses for an x-axis, a y-axis and a z-axis respectively, together with gradient magnetic field pulses of Gx, Gy and Gz. At this time, a 90 degrees pulse for selection excitation is used for the P1 pulse, the P3 pulse and the P8 pulse. By doing in this way, the apparatus can select information through a voxel selection, can specify spatial positional information in triaxial directions including an x-axis direction, a y-axis direction and a z-axis direction, and can observe a specific spatial 1HMRS. It is also possible to phase-encode an idle-time between the radiofrequency pulses (for instance, idle-time right before detecting nuclear magnetic resonance signal), as is illustrated in FIG. 10. The sequence illustrated in FIG. 10 enables 1HMRS imaging in a certain slice by once applying the slice selection pulse, and performing the phase encoding toward two axial directions. By the way, in the pulse sequence of FIG. 10, P1 is selected as the slice selection pulse. However, for instance, the P3 pulse or the P8 pulse other than P1 can also be used as the slice selection pulse. A pulse for eliminating a water signal may also be added to the pulse sequence of FIG. 10, as is illustrated in FIG. 11. Furthermore, coherence selection may be combined with the pulse by using a gradient magnetic field pulse.

An Example will now be described below which has detected a selective nuclear magnetic resonance of an isotope-labeled probe agent that has been taken in a cell and tissue, by using a cell sample or a mouse bearing cancer cell as a target and using a triple resonance method disclosed in the present invention.

EXAMPLE

Example 1

A budding yeast (BY4741/4742) was inoculated in 5 mL of a YPD liquid culture medium, and was cultured at 25° C. for two days. Subsequently, 5 mL of the YPD liquid culture medium containing a budding yeast (BY4741/4742) was poured into 100 mL of a YPD liquid culture medium containing 5 mg of isotope-labeled choline which was isotope-labeled with $^{13}C$ and $^{15}N$ and was cultured at 25° C. until the absorbance by the wavelength of 660 nm reached 1.0 by ABS.

The culture medium was dispensed into two conical tubes of 50 mL, and the yeast cells were spin down at 1,000×g for 10 minutes and were collected. The yeast cells in each tube were suspended in 50 mL of a phosphoric acid buffer, and were spin down at 1,000×g for 10 minutes. The above described operation was repeated for three times in total, and the cleaned yeast cells were suspended in the smallest amount of YPD (approximately two to three times of pellet capacity) and were subjected to measurement for the signal of $^{1}H$ nuclear magnetic resonance.

Figure 12:
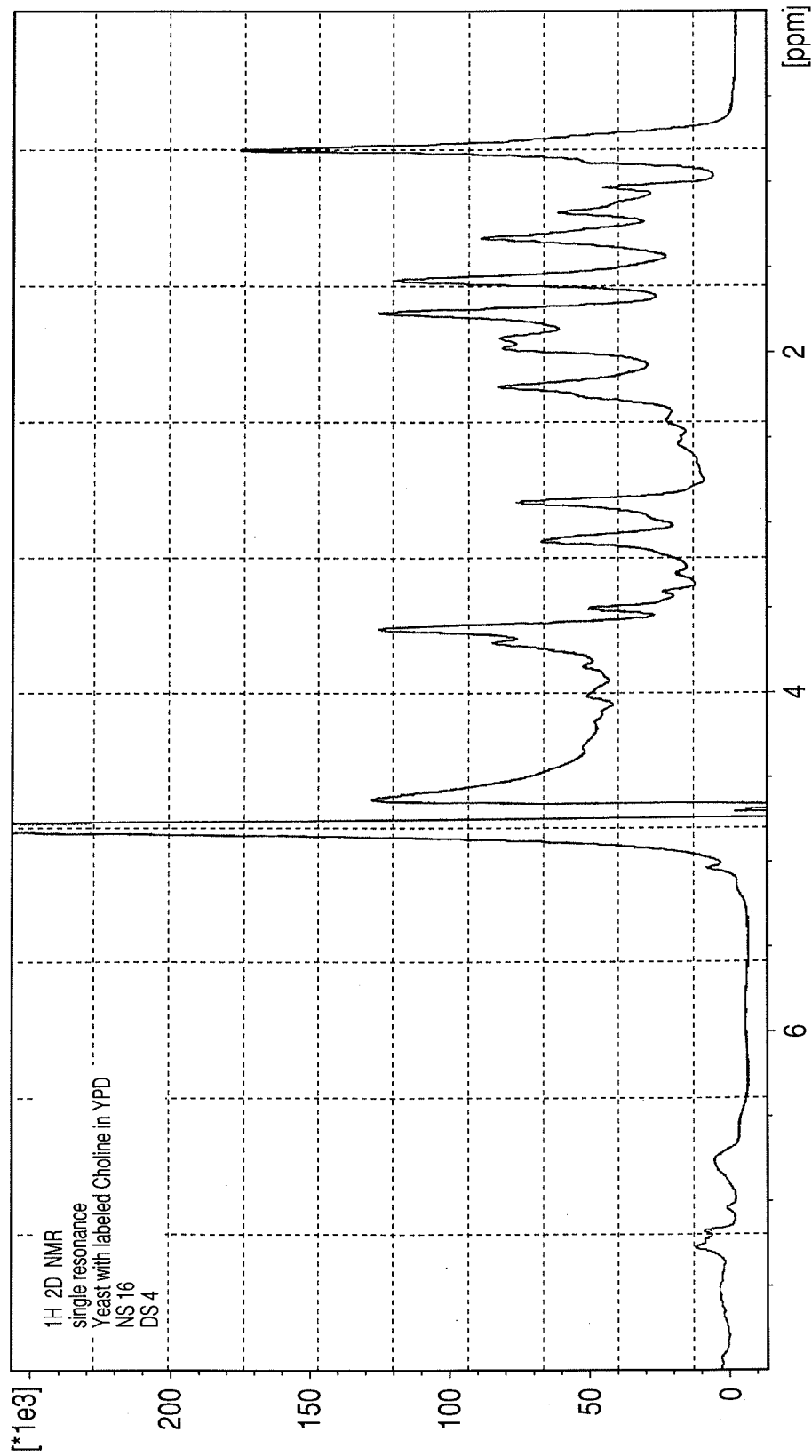
FIG. 12 is a $^1$H nuclear magnetic resonance spectrum of a budding yeast which has been made to take in isotope-labeled choline (Example 1).

FIG. 12 illustrates a measured data of signals of ordinary $^{1}H$ nuclear magnetic resonance. In the data of FIG. 12, a plurality of signals coming from the budding yeast component is detected, and it is difficult to selectively detect the nuclear magnetic resonance signal of the isotope-labeled choline.

Figure 13:
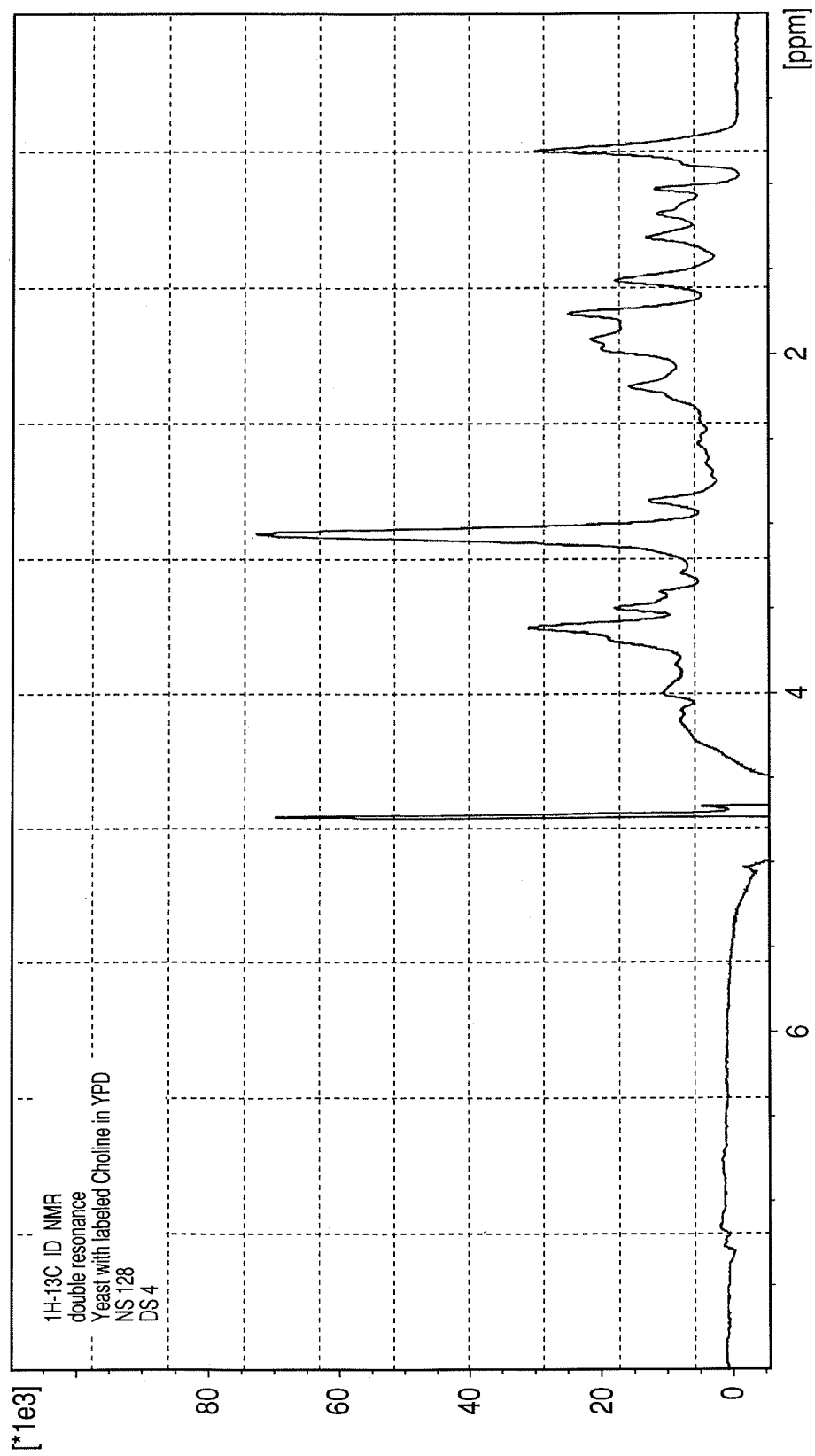
FIG. 13 is a nuclear magnetic resonance spectrum of a budding yeast which has been made to take in isotope-labeled choline (Example 1), and has been observed with the use of a double resonance method.

FIG. 13 shows a data on a measured signal of $^{1}H$ nuclear magnetic resonance with the use of a double resonance method. In FIG. 13 as well, a plurality of signals of $^{1}H$ nuclear magnetic resonance is detected, and it is difficult to selectively detect the nuclear magnetic resonance signal of the isotope-labeled choline.

Figure 14:
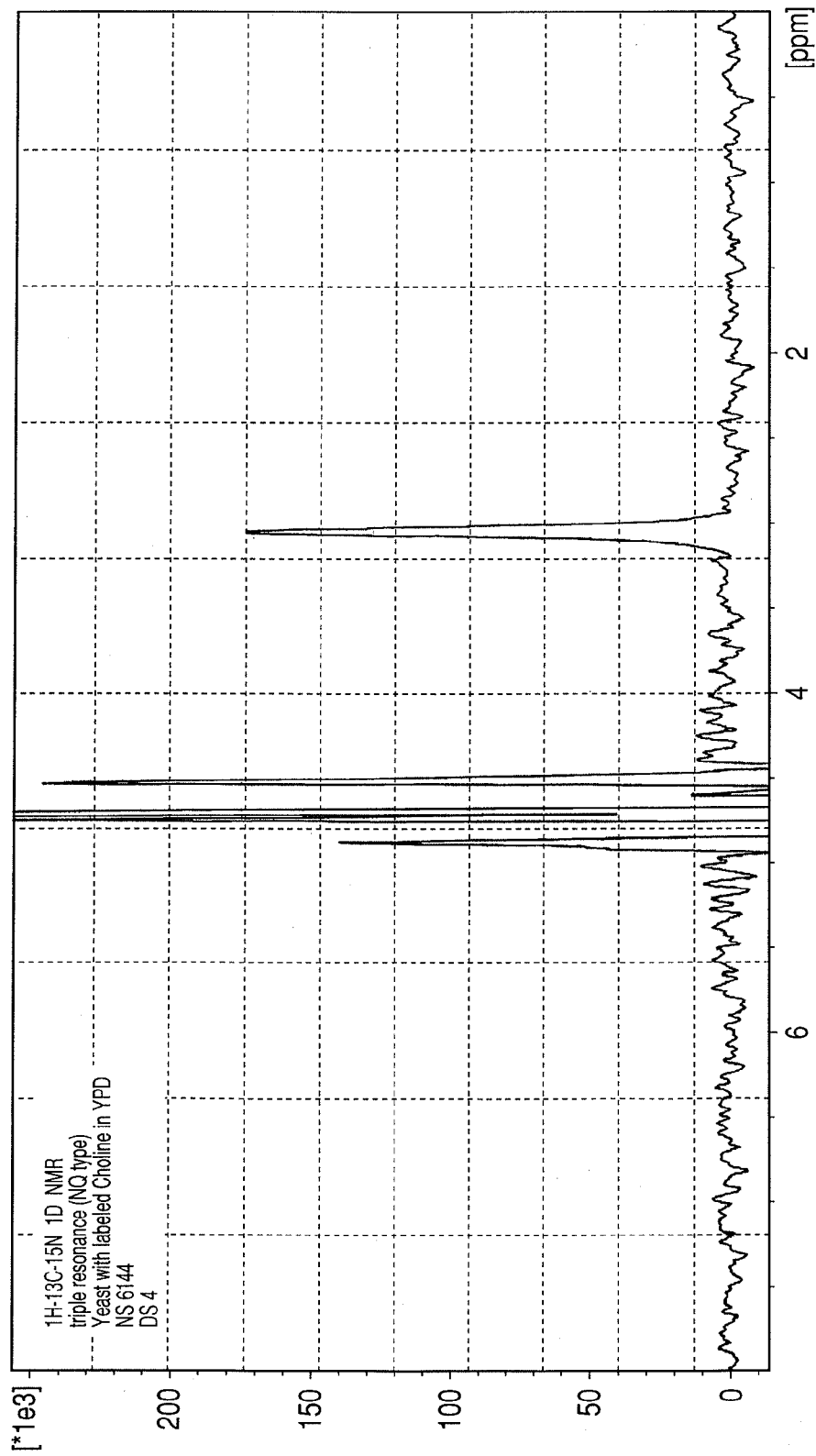
FIG. 14 is one example of a nuclear magnetic resonance spectrum of a budding yeast which has been made to take in isotope-labeled choline (Example 1), and has been observed with the use of a triple resonance method disclosed in the present invention.

On the other hand, FIG. 14 shows a data on a measured signal of $^{1}H$ nuclear magnetic resonance with the use of the triple resonance method according to the present invention. In FIG. 14, it is understood that a signal attributed to the isotope-labeled choline is selectively observed in the vicinity of 3 ppm. Incidentally, a signal observed in a range of 4 to 5 ppm originates in water.

Figure 15:
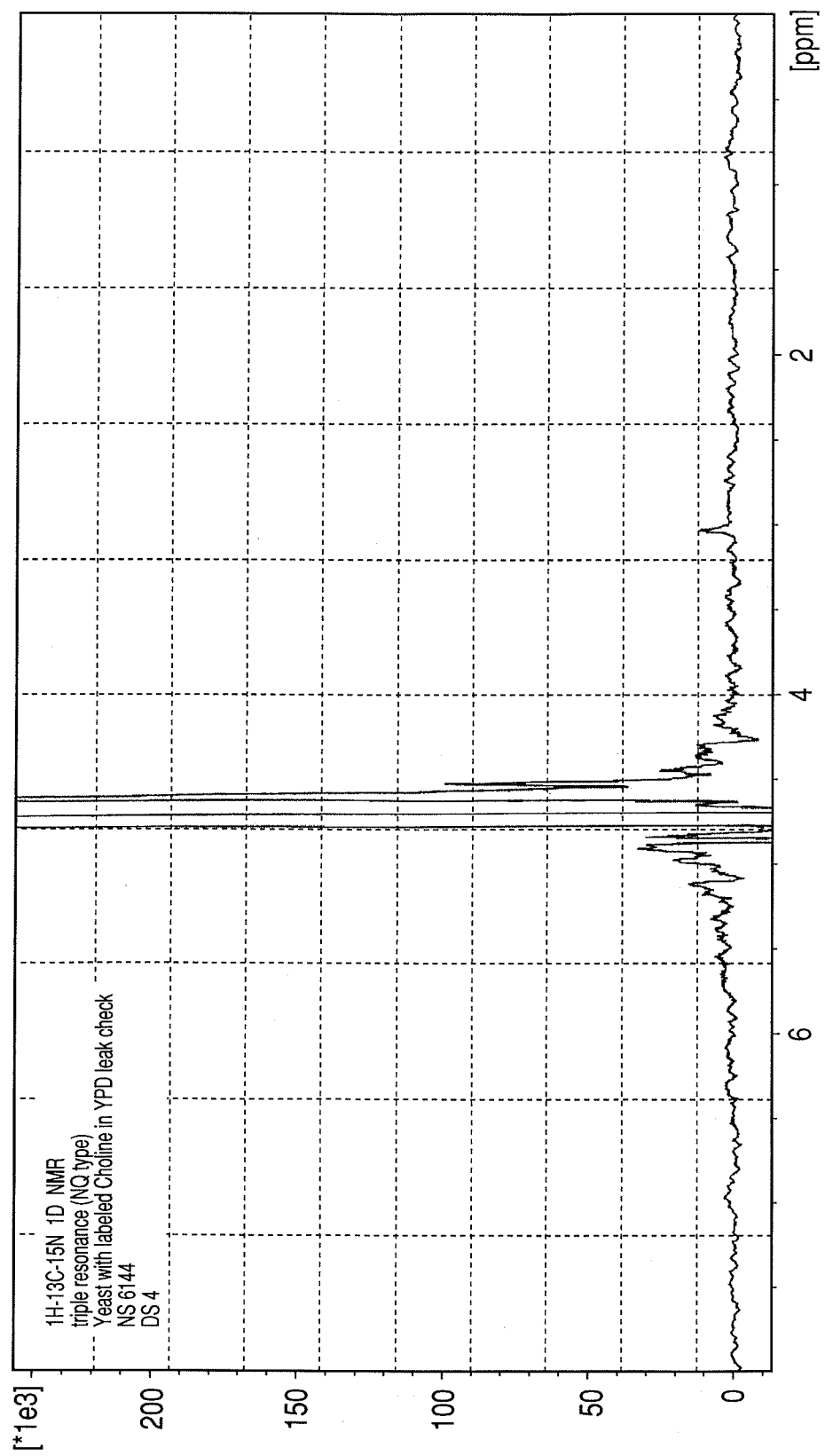
FIG. 15 is a nuclear magnetic resonance spectrum of a supernatant in a sample of a budding yeast that has been made to take in isotope-labeled choline (Example 1), which has been observed with the use of a triple resonance method disclosed in the present invention.

In addition, after the above described signal of $^{1}H$ nuclear magnetic resonance has been measured, a supernatant of the yeast cell sample was taken out, was cryopreserved and melted. Then, the melted supernatant was subjected to measurement for the signal of the $^{1}H$ nuclear magnetic resonance with the use of the triple resonance method. The result is shown in FIG. 15. As is illustrated in FIG. 15, it was confirmed that the supernatant of the yeast cell sample contained only an extremely small amount of the above described isotope-labeled choline. From the result, it was confirmed that the signal of the $^{1}H$ nuclear magnetic resonance observed in FIG. 14 came from the isotope-labeled choline which had been taken in by the yeast cell.

Example 2

Figure 16:
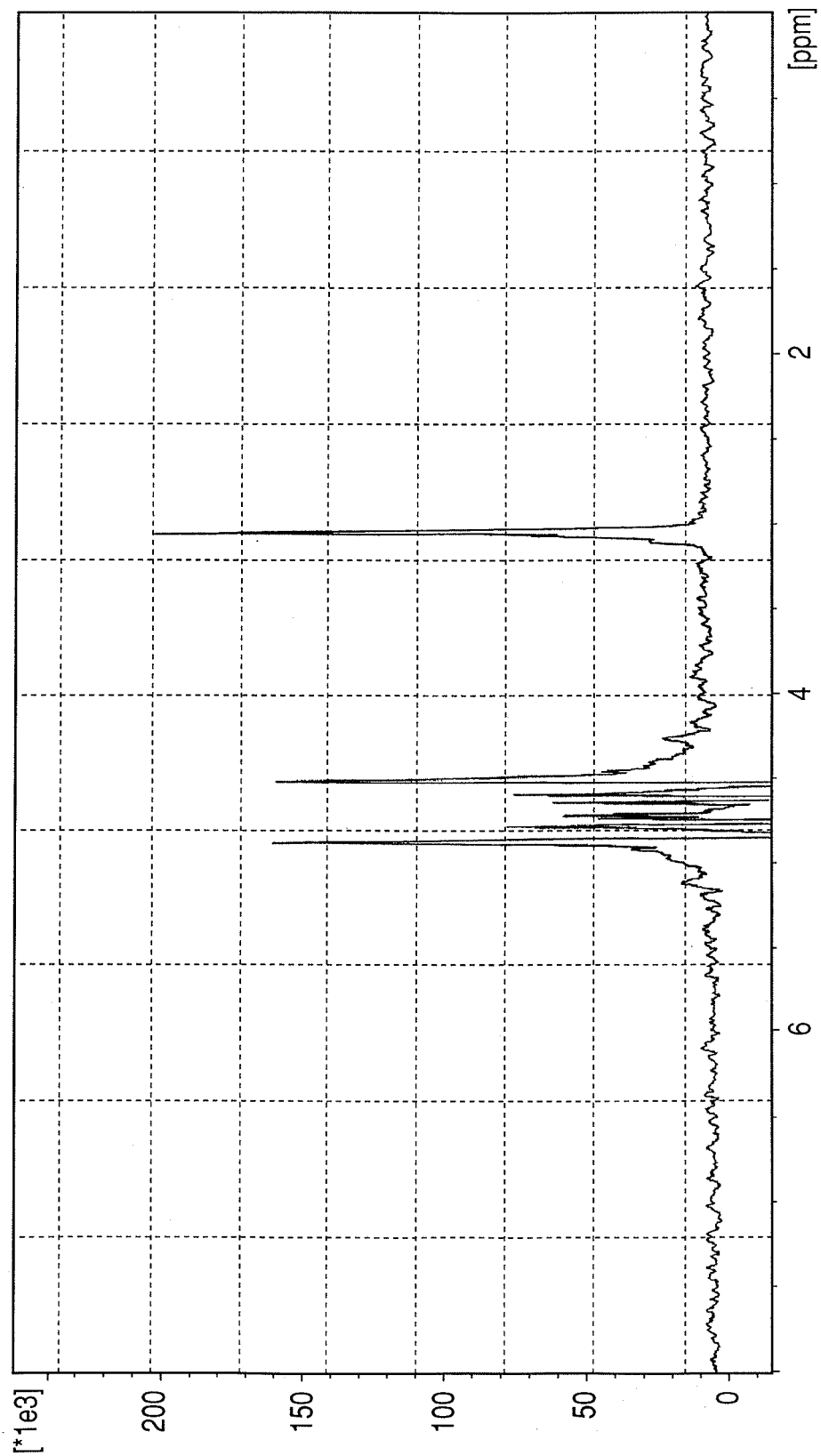
FIG. 16 is one example of a nuclear magnetic resonance spectrum of HeLa cells which have been made to take in isotope-labeled choline (Example 2), and have been observed with the use of a triple resonance method disclosed in the present invention.

Taking in HeLa Cell of $^{13}C_3$—$^{15}N$-choline chloride and Confirming by Triple Resonance Nuclear Magnetic Resonance At first, $^{13}C_3$—$^{15}N$-choline chloride (10 mg namely 69.6 µmol) was dissolved in a DMEM (Dulbecco's Modified Eagle's Medium) culture medium (5 ml), was filtered with the use of a millipore filter having a pore diameter of 220 nm, and was sterilized. The filtrates in respective amounts of 1 ml were added to five pieces of laboratory dishes. DMEM (9 ml) and HeLa cells (approximately 250,000 pieces) were added into each laboratory dish, and then the cells were incubated at 37° C. for five days in the presence of 5% $CO_2$. Then, DMEM was removed, and the HeLa cells on the laboratory dish were cleaned with the use of phosphate buffer PBS(–) (5 ml). Subsequently, trypsin-EDTA (1.5 ml) was added to each laboratory dish, incubated the HeLa cells at room temperature for one minute, and was removed. The HeLa cells having exfoliated from the laboratory dish in each of five pieces of the laboratory dishes were pipetted with the use of PBS(–) (10 ml), and then all of the cells (approximately 15,000,000 pieces) were collected into a tube of 50 ml. The HeLa cells were precipitated by centrifugal separation, and the supernatant was removed. The HeLa cells were cleaned by the similar operation twice, was then sufficiently dried, and was then subjected to measurement for the signal of $^1H$ nuclear magnetic resonance with the use of the triple resonance method according to the present invention. As a result, a signal attributed to isotope-labeled choline was selectively observed, as in Example 1. The result is shown in FIG. 16.

Figure 17:
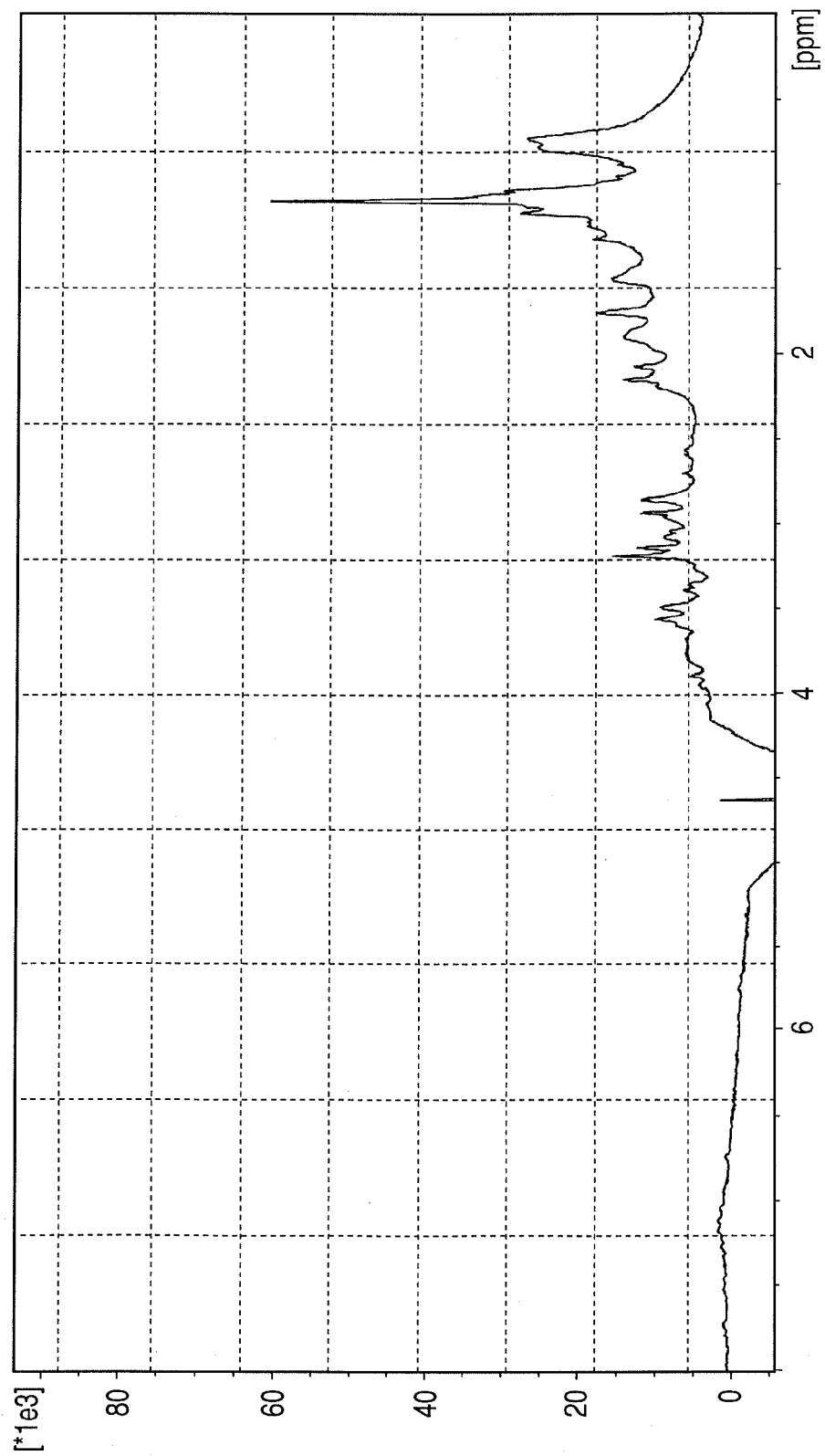
FIG. 17 is a $^1$H nuclear magnetic resonance spectrum of HeLa cells which have been made to take in isotope-labeled choline (Example 2).

On the other hand, FIG. 17 illustrates a measured data of signals of ordinary $^1H$ nuclear magnetic resonance. In the data of FIG. 17, a plurality of signals coming from the HeLa cell component is detected, and it is difficult to selectively detect the nuclear magnetic resonance signal of the isotope-labeled choline.

Example 3

Taking in HeLa Cell of $^{13}C_3$—$^{15}N$-choline chloride and Confirming by Triple Resonance NMR (Part 2)

Figure 18:
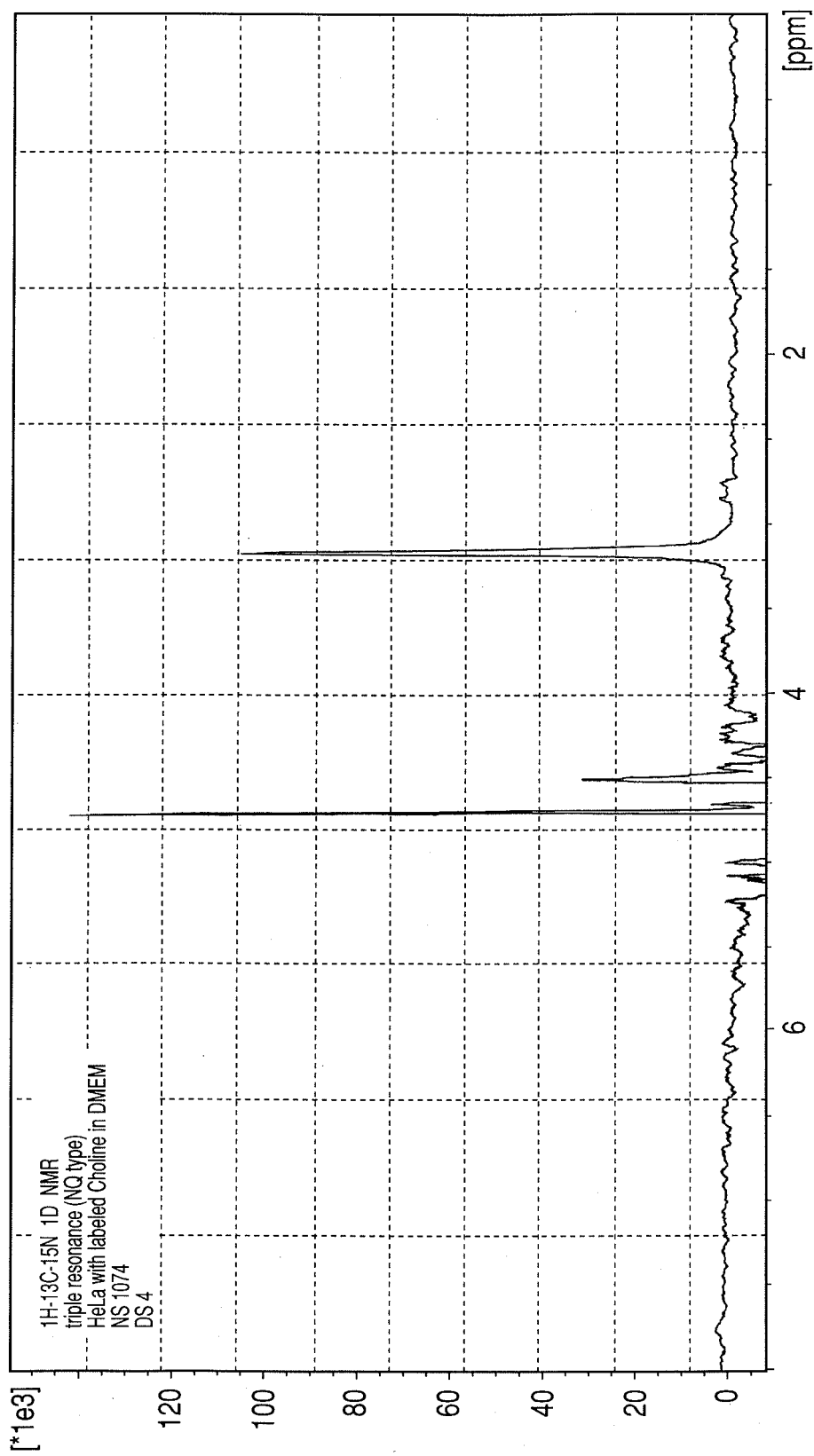
FIG. 18 is an example of a nuclear magnetic resonance spectrum of HeLa cells which have been made to take in isotope-labeled choline (Example 3), and have been observed with the use of a triple resonance method disclosed in the present invention.

The experiment was carried out in a similar way to the above described Example 2, and then the HeLa cells were collected into a tube of 50 ml. The HeLa cells were precipitated by centrifugal separation, and the supernatant was removed. The HeLa cells were subjected to measurement for the signal of $^1H$ nuclear magnetic resonance with the use of the triple resonance method according to the present invention, without being dried (Almost all of the cells were confirmed to be living cells by trypan blue staining carried out after measurement). As a result, a signal attributed to isotope-labeled choline was selectively observed. The result is shown in FIG. 18.

Figure 19:
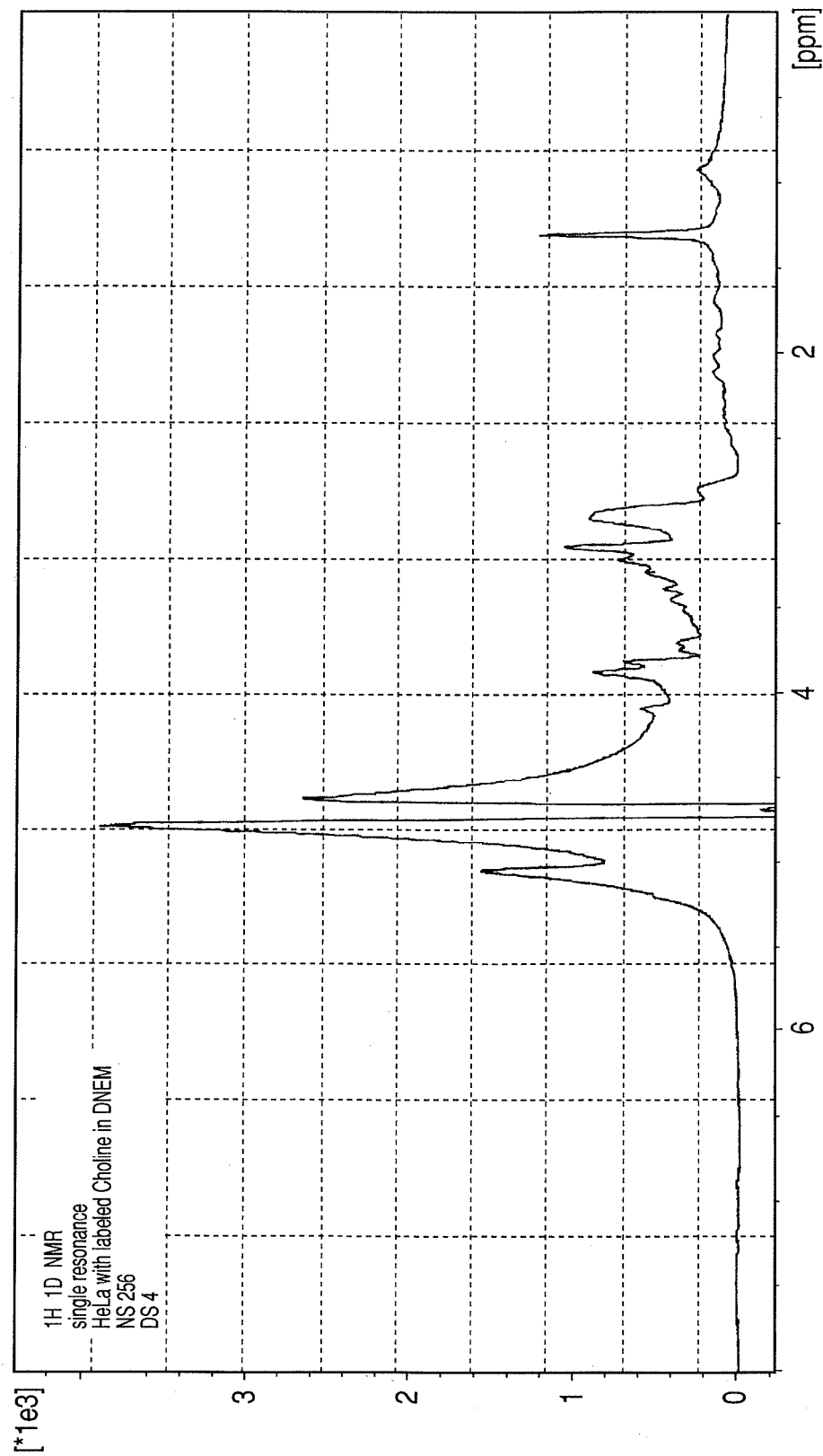
FIG. 19 is a $^1$H nuclear magnetic resonance spectrum of HeLa cells which have been made to take in isotope-labeled choline (Example 3).
Figure 20:
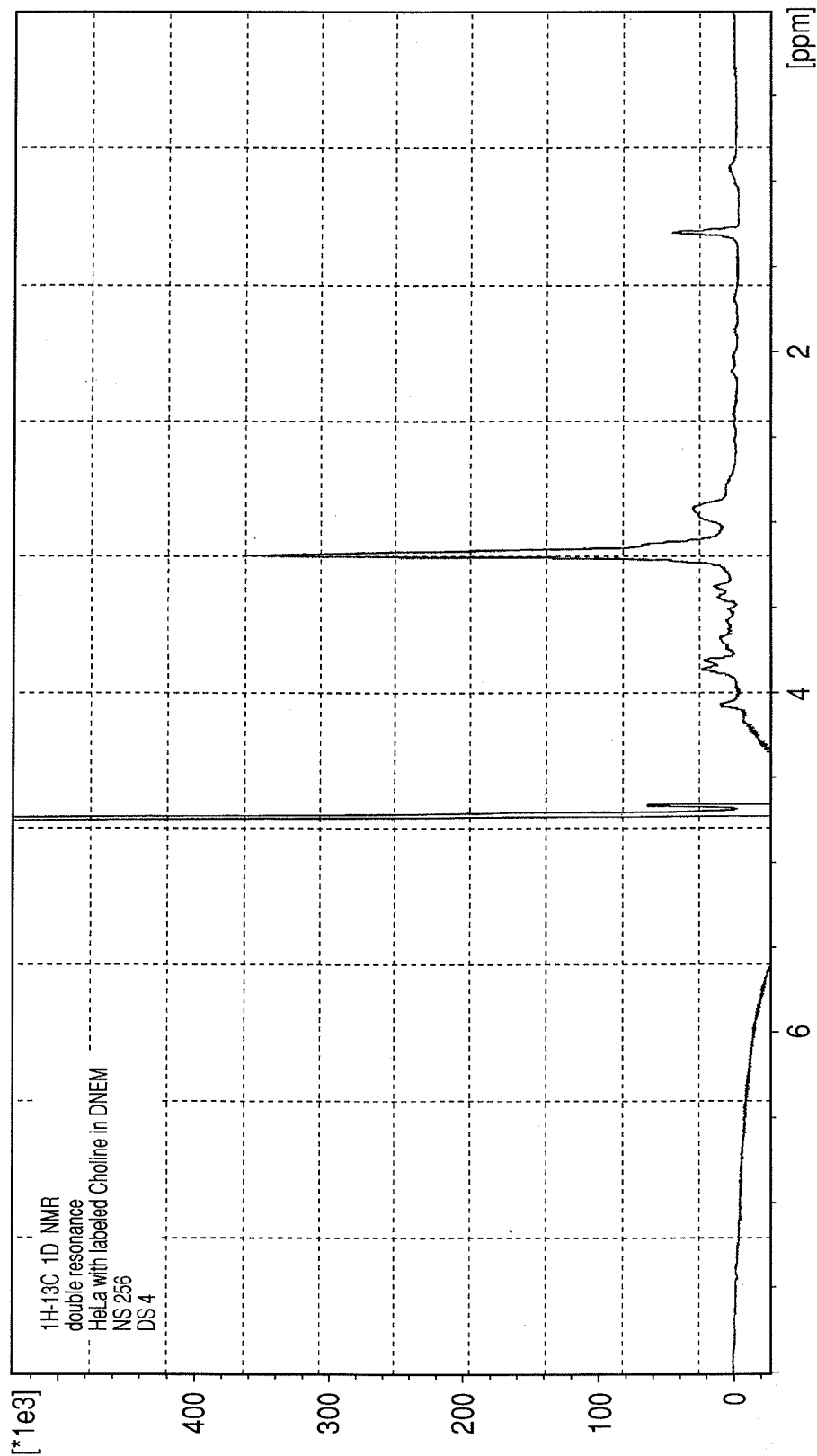
FIG. 20 is a nuclear magnetic resonance spectrum of HeLa cells which have been made to take in isotope-labeled choline (Example 3), and have been observed with the use of a double resonance method.
Figure 21:
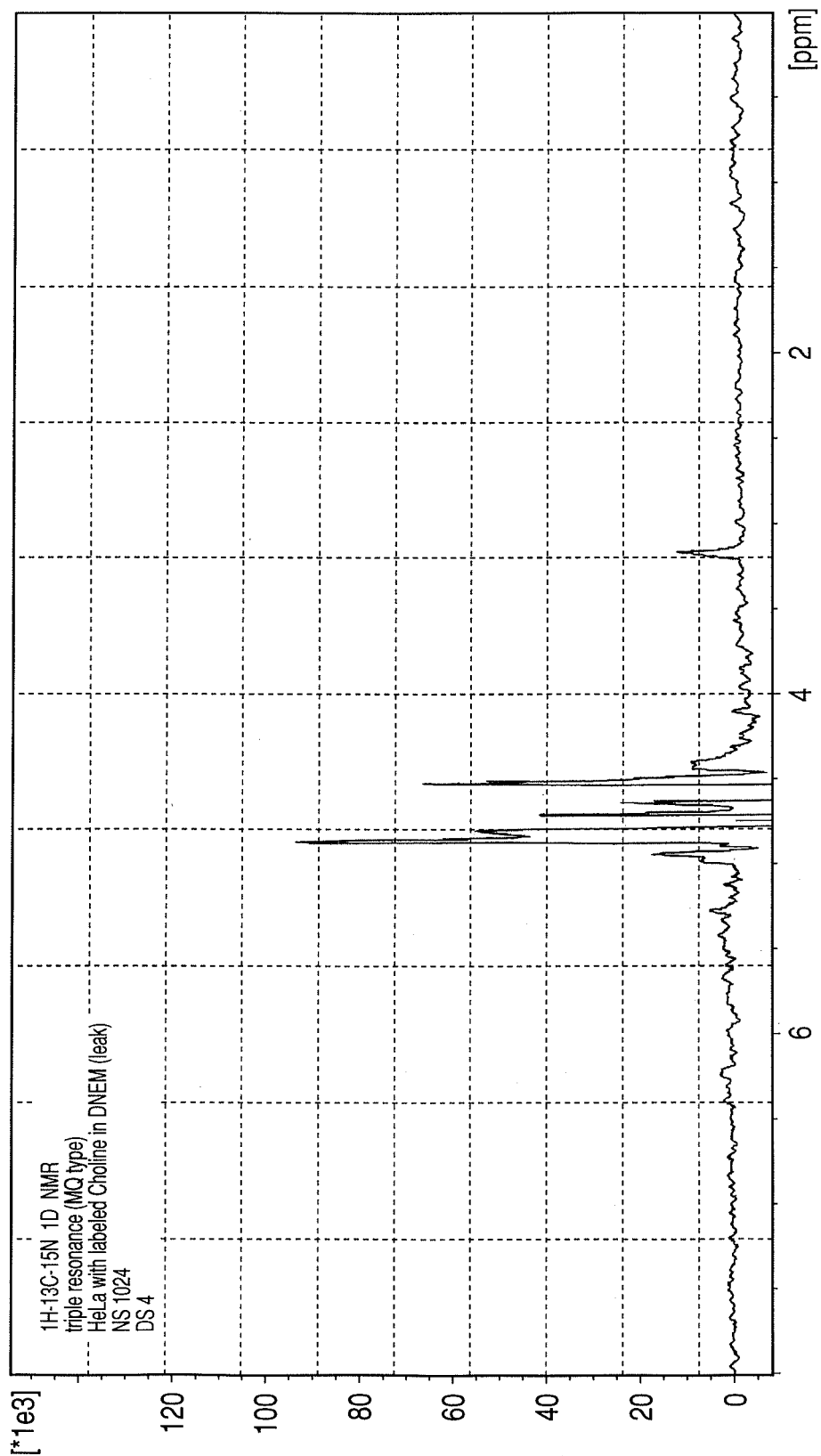
FIG. 21 is a nuclear magnetic resonance spectrum of a supernatant in a sample of HeLa cells that have been made to take in isotope-labeled choline (Example 3), which has been observed with the use of a triple resonance method disclosed in the present invention.
Figure 22:
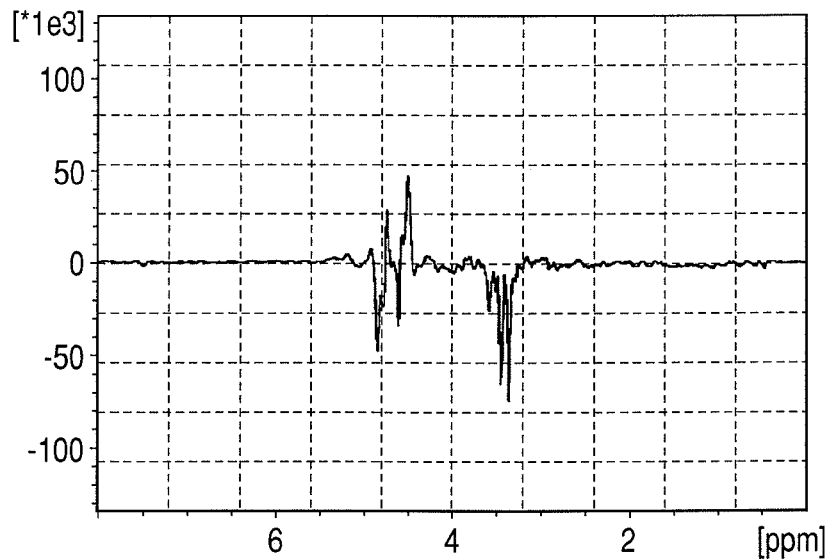
FIG. 22 is a nuclear magnetic resonance spectrum of a blood of cancer-bearing mouse, which has been observed with the use of a triple resonance method disclosed in the present invention.
Figure 23:
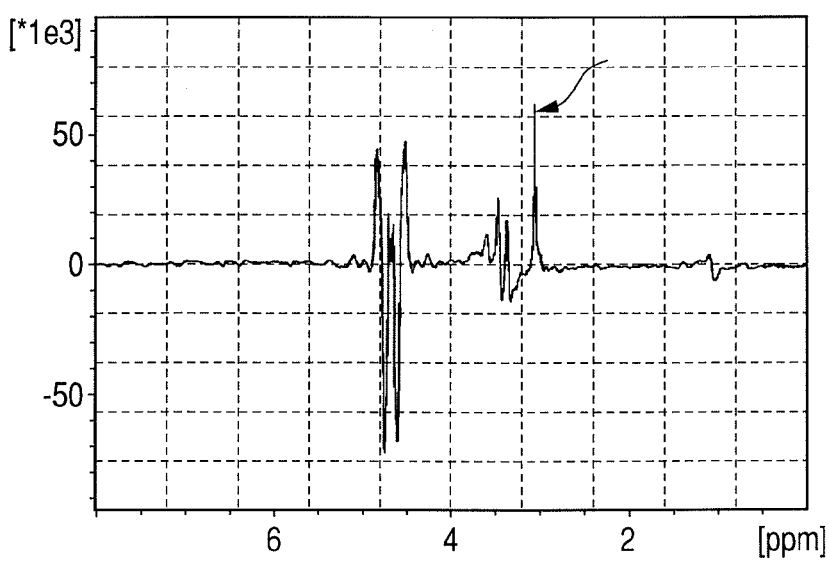
FIG. 23 is a nuclear magnetic resonance spectrum of a liver of cancer-bearing mouse, which has been observed with the use of a triple resonance method disclosed in the present invention.
Figure 24:
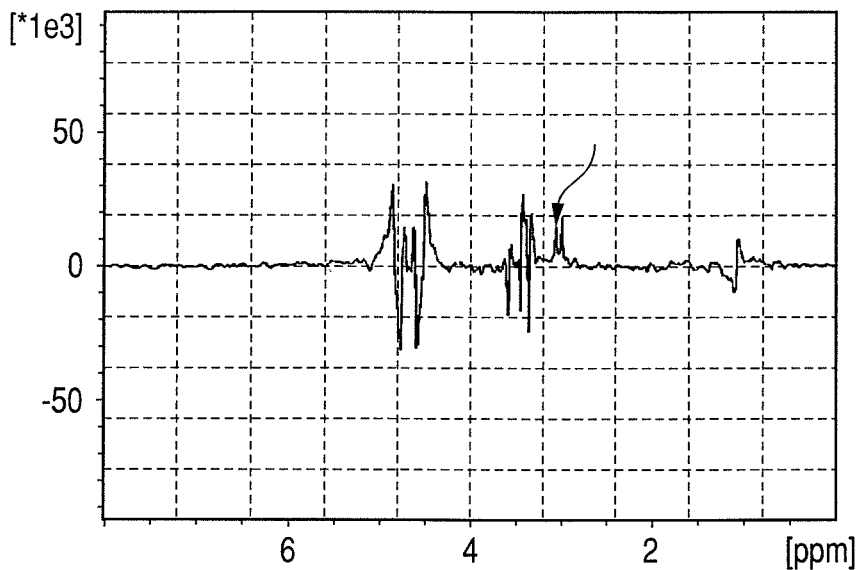
FIG. 24 is a nuclear magnetic resonance spectrum of a kidney of cancer-bearing mouse, which has been observed with the use of a triple resonance method disclosed in the present invention.
Figure 25:
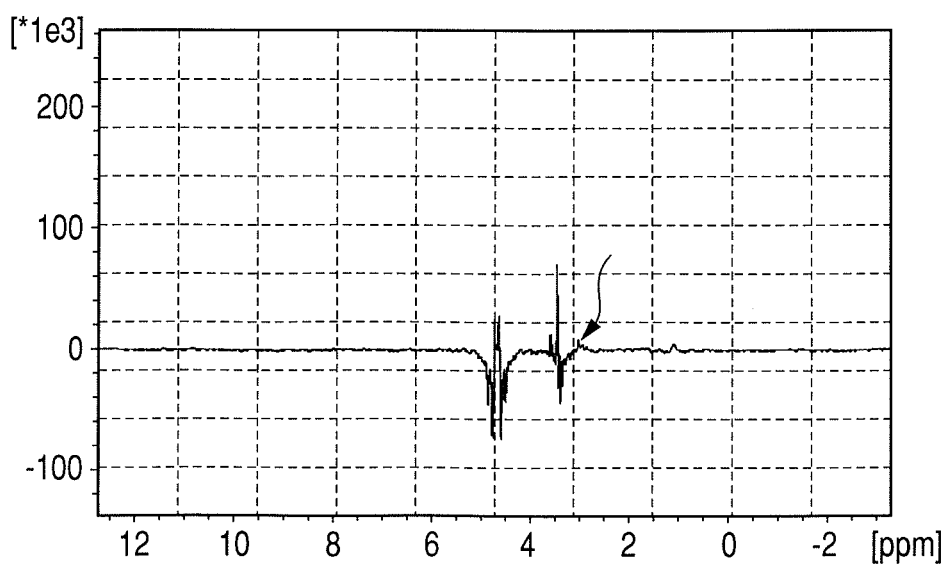
FIG. 25 is a nuclear magnetic resonance spectrum of a cancer tissue of cancer-bearing mouse, which has been observed with the use of a triple resonance method disclosed in the present invention.

On the other hand, FIG. 19 shows a measured data of signals of ordinary $^1H$ nuclear magnetic resonance, and FIG. 20 shows a data of measured signals of $^1H$ nuclear magnetic resonance with the use of a double resonance method. In the data of FIG. 19, a plurality of signals coming from the HeLa cell component is detected, and it is difficult to selectively detect the nuclear magnetic resonance signal of the isotope-labeled choline. In the data of FIG. 20 as well, a signal which is considered to come from the HeLa cell component is detected, though being a small amount. In addition, after the above described signal of $^1H$ nuclear magnetic resonance has been measured, a supernatant of the HeLa cell sample was taken out, and was subjected to measurement for the signal of the $^1H$ nuclear magnetic resonance with the use of the triple resonance method. The result is shown in FIG. 21. As is shown in FIG. 21, it is understood that the signal of the above described isotope-labeled choline is apparently weaker in the spectrum of the supernatant of the HeLa cell sample than in the spectrum shown in FIG. 18. From the result, it was confirmed that the $^1H$ nuclear magnetic resonance signal observed in FIG. 18 came from the isotope-labeled choline that had been taken in HeLa cells.

Example 4

Administration of $^{13}C_3$—$^{15}N$-choline chloride into Cancer Cell-Bearing Mouse and Confirming by Triple Resonance NMR $^{13}C_3$—$^{15}N$-choline chloride was administered into a cancer cell-bearing mouse according the following procedure, evidence of $^{13}C_3$—$^{15}N$-choline chloride in each organ was confirmed by measuring by means of nuclear magnetic resonance method.

(i) Preparation of Cancer-Bearing Mouse

Saline (50 ml) was added to BALB/c mouse keeping meth-A cell in abdominal cavity by means of syringe, and meth-A cell was collected. The cell was precipitated by centrifugal separation, and then supernatant solution was removed, and the precipitate was dissolved in PBS (50 ml). The cell number of this PBS solution was counted and the cell number was controlled to be $2.0 \times 10^7$ number/ml. 100 µl of this sample was administered subcutaneously to left leg of BAVB/c mouse which was prepared new.

(ii) Administration of Double Labeled Choline/Anatomy/NMR Analysis

Double labeled choline PBS solution (2 mg/ml, 100 µl) was administered into cancer-bearing mouse from vein of tail. After 1 hour, mouse was cut open and required organs (blood (200 µl), liver, kidney, and cancer) were taken out in sequence, and were collected individually in micro tube. 1× Lysis buffer (500 µl) was added to each of the tubes, each organ was crushed by means of beads and insoluble matter was precipitated by centrifugal separation (4° C., 14000 rpm, 30 minutes), and then the supernatant solution was collected and by using such supernatant solution the triple resonance NMR utilizing magnetic coherence transfer between three elements of $^1H$—$^{13}C$—$^{15}N$ was carried out (see FIGS. 22, 23, 24 and 25).

As the result of the analysis above, a signal in 3.0 ppm coming from a methyl group of choline can be detected in a liver, a kidney, and a cancer.

The summary of the above description on the present invention will be described below.

At first, the present invention provides a nuclear magnetic resonance signal measuring method which aims a compound containing a nucleus capable of transmitting a nuclear magnetic resonance signal, as a measurement target, characterized in that the method selects an isotope-labeled compound as the measurement target, in which at least two nuclei which can transmit the nuclear magnetic resonance signals, have each different nuclear magnetic resonance frequency and are bonded to each other are isotope-labeled at a higher ratio than a natural isotope abundance ratio; has a process for selectively observing the nuclear magnetic resonance signal and positional information of a first nucleus contained in the isotope-labeled compound by using a pulse sequence having a unit of observing the nuclear magnetic resonance signal of the first nucleus contained in the isotope-labeled compound, which has passed magnetization transfer from the first nucleus to a second nucleus, magnetization transfer from the second nucleus to a third nucleus, magnetization transfer from the third nucleus to the second nucleus, and magnetization transfer from the second nucleus to the first nucleus, between three nuclei which include at least two nuclei that are contained in the isotope-labeled compound existing in a measurement sample, are isotope-labeled and are bonded to each other, can transmit nuclear magnetic resonance signals, have different nuclear magnetic resonance frequencies from each other and are bonded to each other, and a unit of adding positional information to the nuclear magnetic resonance signal of the first nucleus contained in the isotope-labeled compound; and thereby decreases a nuclear magnetic resonance signal of a nuclide of the same type as the first nucleus contained in a compound which is not isotope-labeled, and selectively observes the nuclear magnetic resonance signal of the first nucleus contained in the isotope-labeled compound.

At least two of the nuclei which are isotope-labeled and are bonded to each other can be each independently selected from any one of a carbon-13, a nitrogen-15, an oxygen-17, and a sulphur-33.

The first nucleus can be selected from any one of a hydrogen-1, a fluorine-19 and a phosphorous-31. The second nucleus and the third nucleus can be each independently selected from any one of the carbon-13, the nitrogen-15, the oxygen-17 and the sulphur-33.

The measurement sample may be any of a living body, a living tissue and a living cell. Here, the living body has a concept including a human body. The isotope-labeled compound can have the same chemical structure as a substance in a living body.

The magnetization of the first nucleus is transferred to the second nucleus in a single quantum coherent state, and the magnetization of the second nucleus is transferred to the third nucleus in a single quantum coherent state or in a multi-quantum coherent state.

Specific aspects of the present invention will now be described below.

(1) A nuclear magnetic resonance signal measuring method is characterized in that the method includes at least the sequential steps of: generating a radiofrequency pulse corresponding to a resonance frequency of a first nucleus; generating radiofrequency pulses corresponding to respective resonance frequencies of the first nucleus and the second nucleus, while evolution of the transverse magnetization of the first nucleus; generating radiofrequency pulses corresponding to respective resonance frequencies of the first nucleus and the second nucleus; generating radiofrequency pulses corresponding to respective resonance frequencies of the first nucleus and the third nucleus, while evolution of the anti-phase transverse magnetization of the second nucleus; generating radiofrequency pulses corresponding to respective resonance frequencies of the first nucleus and the third nucleus, after having generated the double anti-phase transverse magnetization of the second nucleus; generating radiofrequency pulses corresponding to respective resonance frequencies of the first nucleus and the second nucleus, while evolution of the transverse magnetization of the third nucleus; generating radiofrequency pulses corresponding to respective resonance frequencies of the first nucleus and the third nucleus; generating radiofrequency pulses corresponding to respective resonance frequencies of the first nucleus and the second nucleus, after having waited for the anti-phase transverse magnetization of the second nucleus to be refocused; generating radiofrequency pulses corresponding to respective resonance frequencies of the first nucleus and the second nucleus, while evolution of the anti-phase transverse magnetization of the first nucleus; and observing a in-phase transverse magnetization of the first nucleus.

(2) A nuclear magnetic resonance signal measuring method is characterized in that the method includes at least the sequential steps of: generating a radiofrequency pulse corresponding to a resonance frequency of the first nucleus; generating radiofrequency pulses corresponding to respective resonance frequencies of the first nucleus and the second nucleus, while evolution of the transverse magnetization of the first nucleus; generating radiofrequency pulses corresponding to respective resonance frequencies of the first nucleus and the second nucleus; generating radiofrequency pulses corresponding to respective resonance frequencies of the second nucleus and the third nucleus, while evolution of the anti-phase transverse magnetization of the second nucleus; generating radiofrequency pulses corresponding to respective resonance frequencies of the second nucleus and the third nucleus; generating radiofrequency pulses corresponding to respective resonance frequencies of the second nucleus and the third nucleus; generating radiofrequency pulses corresponding to respective resonance frequencies of the second nucleus and the third nucleus, while evolution of the anti-phase transverse magnetization of the second nucleus; generating radiofrequency pulses corresponding to respective resonance frequencies of the first nucleus and the second nucleus; generating radiofrequency pulses corresponding to respective resonance frequencies of the first nucleus and the second nucleus, while evolution of the anti-phase transverse magnetization of the first nucleus; and observing a generated in-phase transverse magnetization of the first nucleus.

(3) A nuclear magnetic resonance signal measuring method is characterized in that the method includes at least the sequential steps of: generating a radiofrequency pulse corresponding to a resonance frequency of the first nucleus; generating radiofrequency pulses corresponding to respective resonance frequencies of the first nucleus and the second nucleus, while evolution of the transverse magnetization of the first nucleus; generating radiofrequency pulses corresponding to respective resonance frequencies of the first nucleus and the second nucleus; generating radiofrequency pulses corresponding to respective resonance frequencies of the first nucleus, the second nucleus, and third nucleus, while evolution of the anti-phase transverse magnetization of the second nucleus; generating a first spinlock pulse which can generate cross polarization between the second nucleus and the third nucleus; generating a first radiofrequency pulse corresponding to a resonance frequency of the third nucleus; generating a second radiofrequency pulse corresponding to a resonance frequency of the third nucleus; generating a second spinlock pulse which can generate cross polarization between the second nucleus and the third nucleus; generating radiofrequency pulses corresponding to respective resonance frequencies of the first nucleus, the second nucleus, and the third nucleus, while evolution of the anti-phase transverse magnetization of the second nucleus; generating radiofrequency pulses corresponding to respective resonance frequencies of the first nucleus and the second nucleus; generating radiofrequency pulses corresponding to respective resonance frequencies of the first nucleus and the second nucleus, while evolution of the anti-phase transverse magnetization of the first nucleus; and observing a generated in-phase transverse magnetization of the first nucleus.

The nuclear magnetic resonance signal measuring method in the aspect (3) can have at least the step of generating a gradient magnetic field pulse, in between the step of generating a first radiofrequency pulse corresponding to a resonance frequency of the third nucleus and the step of generating a second radiofrequency pulse corresponding to a resonance frequency of the third nucleus.

All these aspects can have the following steps. The aspects can have the steps of: generating a radiofrequency pulse for exciting water; and conducting irradiation with a gradient magnetic field pulse which can cancel a signal of water. The aspects can also have a step of generating a gradient magnetic field pulse which can achieve coherence selection. Any one of a plurality of radiofrequency pulses corresponding to a resonance frequency of the second nucleus can be a selective excitation pulse. The aspects can employ a frequency-selective excitation pulse for any three of a plurality of radiofrequency pulses corresponding to a resonance frequency of the first nucleus, and can generate gradient magnetic field pulses each in an x-axis direction, a y-axis direction and a z-axis direction, at the same time when generating each of the selective excitation pulses. The aspects can perform phase encoding to any two directions of the x-axis direction, the y-axis direction and the z-axis direction, while a plurality of radiofrequency pulses corresponding to the resonance frequency of the first nucleus is not generated. The aspects can employ a frequency-selective excitation pulse for any one of a plurality of radiofrequency pulses corresponding to a resonance frequency of the first nucleus; and have a step of generating a gradient magnetic field pulse in any one direction of the x-axis direction, the y-axis direction and the z-axis direction, at the same time when generating the selective excitation pulse, and a step of performing phase encoding to two remaining directions of an x-axis direction, a y-axis direction and a z-axis direction, while a plurality of radiofrequency pulses corresponding to a resonance frequency of the first nucleus is not generated.

The summary of the present invention will now be described from a different viewpoint.

The present invention viewed from the different viewpoint is a nuclear magnetic resonance signal measuring method which aims a compound containing a nucleus capable of transmitting a nuclear magnetic resonance signal, as a measurement target, characterized in that the method selects an isotope-labeled compound as the measurement target, in which at least two nuclei which can transmit the nuclear magnetic resonance signals, have each different nuclear magnetic resonance frequency and are bonded to each other are isotope-labeled at a higher ratio than a natural isotope abundance ratio; has the steps of adding the isotope-labeled compound to the measurement sample, and selectively observing the nuclear magnetic resonance signal and positional information of a first nucleus contained in the isotope-labeled compound by using a pulse sequence having a unit of observing the nuclear magnetic resonance signal of the first nucleus contained in the isotope-labeled compound, which has passed magnetization transfer from the first nucleus to a second nucleus, magnetization transfer from the second nucleus to a third nucleus, magnetization transfer from the third nucleus to the second nucleus, and magnetization transfer from the second nucleus to the first nucleus, between three nuclei which include at least two nuclei that are contained in the isotope-labeled compound, are isotope-labeled and are bonded to each other, can transmit nuclear magnetic resonance signals, have different nuclear magnetic resonance frequencies from each other and are bonded to each other, and a unit of adding positional information to the nuclear magnetic resonance signal of the first nucleus contained in the isotope-labeled compound; and thereby decreases the nuclear magnetic resonance signal of the nuclide of the same type as the first nucleus contained in the compound which is not isotope-labeled, and selectively observes the nuclear magnetic resonance signal of the first nucleus contained in the isotope-labeled compound.

Specific aspects of the present invention from the different viewpoint will now be described below.

(1a) A nuclear magnetic resonance signal measuring method has at least the sequential steps of: irradiating the first nucleus with a radiofrequency pulse corresponding to the resonance frequency of the first nucleus in order to generate a transverse magnetization of the first nucleus; irradiating the first nucleus and the second nucleus with radiofrequency pulses corresponding to the respective resonance frequencies, while evolution of the transverse magnetization of the first nucleus; irradiating the first nucleus and the second nucleus with radiofrequency pulses corresponding to the respective resonance frequencies, in order to transfer a generated anti-phase transverse magnetization of the first nucleus to a anti-phase transverse magnetization of the second nucleus; irradiating the first nucleus and the third nucleus with radiofrequency pulses corresponding to the respective resonance frequencies, while evolution of the anti-phase transverse magnetization of the second nucleus; irradiating the first nucleus and the third nucleus with radiofrequency pulses corresponding to the respective resonance frequencies in order to convert a double anti-phase transverse magnetization of the second nucleus into a multi-quantum coherent state, after having generated the double anti-phase transverse magnetization of the second nucleus, and transfer magnetization from the second nucleus to the third nucleus; irradiating the first nucleus and the second nucleus with radiofrequency pulses corresponding to the respective resonance frequencies, while evolution of a transverse magnetization of the third nucleus; irradiating the first nucleus and the third nucleus with radiofrequency pulses corresponding to the respective resonance frequencies in order to convert a multi-quantum coherent state of the third nucleus into the double anti-phase transverse magnetization of the second nucleus, and transfer magnetization from the third nucleus to the second nucleus; irradiating the first nucleus and the second nucleus with radiofrequency pulses corresponding to the respective resonance frequencies, in order to transfer the anti-phase transverse magnetization of the second nucleus to the anti-phase transverse magnetization of the first nucleus, after having waited for the anti-phase transverse magnetization of the second nucleus to be refocused; irradiating the first nucleus and the second nucleus with radiofrequency pulses corresponding to the respective resonance frequencies, while evolution of the anti-phase transverse magnetization of the first nucleus; and observing a generated in-phase transverse magnetization of the first nucleus.

(2a) A nuclear magnetic resonance signal measuring method is characterized in that the method has the sequential steps of: irradiating the first nucleus with a radiofrequency pulse corresponding to the resonance frequency thereof, in order to generate a transverse magnetization of the first nucleus; irradiating the first nucleus and the second nucleus with radiofrequency pulses corresponding to the respective resonance frequencies, while evolution of the transverse magnetization of the first nucleus; irradiating the first nucleus and the second nucleus with radiofrequency pulses corresponding to the respective resonance frequencies, in order to transfer a generated anti-phase transverse magnetization of the first nucleus to a anti-phase transverse magnetization of the second nucleus; irradiating the second nucleus and the third nucleus with radiofrequency pulses corresponding to the respective resonance frequencies, while evolution of the anti-phase transverse magnetization of the second nucleus; irradiating the second nucleus and the third nucleus with radiofrequency pulses corresponding to the respective resonance frequencies, in order to transfer the anti-phase transverse magnetization of the second nucleus to a anti-phase transverse magnetization of the third nucleus; irradiating the second nucleus and the third nucleus with radiofrequency pulses corresponding to the respective resonance frequencies, in order to transfer the anti-phase transverse magnetization of the third nucleus to the anti-phase transverse magnetization of the second nucleus; irradiating the second nucleus and the third nucleus with radiofrequency pulses corresponding to the respective resonance frequencies, while evolution of the anti-phase transverse magnetization of the second nucleus; irradiating the first nucleus and the second nucleus with radiofrequency pulses corresponding to the respective resonance frequencies, in order to transfer the anti-phase transverse magnetization of the second nucleus to the anti-phase transverse magnetization of the first nucleus; irradiating the first nucleus and the second nucleus with radiofrequency pulses corresponding to the respective resonance frequencies, while evolution of the anti-phase transverse magnetization of the first nucleus; observing a generated in-phase transverse magnetization of the first nucleus.

(3a) A nuclear magnetic resonance signal measuring method is characterized in that the method has the sequential steps of: irradiating the first nucleus with a radiofrequency pulse corresponding to the resonance frequency thereof, in order to generate a transverse magnetization of the first nucleus; irradiating the first nucleus and the second nucleus with radiofrequency pulses corresponding to the respective resonance frequencies, while evolution of the transverse magnetization of the first nucleus; irradiating the first nucleus and the second nucleus with radiofrequency pulses corresponding to the respective resonance frequencies, in order to transfer a generated anti-phase transverse magnetization of the first nucleus to a anti-phase transverse magnetization of the second nucleus; irradiating the first nucleus, the second nucleus, and third nucleus with radiofrequency pulses corresponding to the respective resonance frequencies, while evolution of the anti-phase transverse magnetization of the second nucleus; conducting irradiation with a first spinlock pulse which can generate cross polarization between the second nucleus and the third nucleus, in order to transfer the magnetization of the second nucleus to a magnetization of the third nucleus; irradiating the first nucleus with a radiofrequency pulse corresponding to the resonance frequency; irradiating the first nucleus with a radiofrequency pulse corresponding to the resonance frequency; conducting irradiation with a second spinlock pulse which can generate cross polarization between the second nucleus and the third nucleus, in order to transfer the magnetization of the third nucleus to the magnetization of the second nucleus; irradiating the first nucleus, the second nucleus, and the third nucleus with radiofrequency pulses corresponding to the respective resonance frequencies, while evolution of the anti-phase transverse magnetization of the second nucleus; irradiating the first nucleus and the second nucleus with radiofrequency pulses corresponding to the respective resonance frequencies, in order to transfer the anti-phase transverse magnetization of the second nucleus to the anti-phase transverse magnetization of the first nucleus; irradiating the first nucleus and the second nucleus with radiofrequency pulses corresponding to the respective resonance frequencies, while evolution of the anti-phase transverse magnetization of the first nucleus; observing a generated in-phase transverse magnetization of the first nucleus.

The aspect (3a) can have at least the steps of conducting irradiation with a gradient magnetic field pulse, in between the step of generating a first radiofrequency pulse corresponding to a resonance frequency of the third nucleus and the step of generating a second radiofrequency pulse corresponding to a resonance frequency of the third nucleus. All these aspects can have the following steps. The aspects can have the step of cancelling a signal of water by using a radiofrequency pulse for exciting water and a gradient magnetic field pulse. A coherence selection also can be performed by using the gradient magnetic field pulse. Any one of a plurality of radiofrequency pulses corresponding to the resonance frequency of the second nucleus, which irradiate the second nucleus, can be a selective excitation pulse. Any three of a plurality of radiofrequency pulses corresponding to the resonance frequency of the first nucleus, which irradiate the first nucleus, can be frequency-selective excitation pulses, and voxel selection can be performed by conducting irradiation with each of gradient magnetic field pulses in an x-axis direction, a y-axis direction and a z-axis direction at the same time when conducting irradiation with each of the selective excitation pulses. Phase encoding can be performed to any two directions of the x-axis direction, the y-axis direction and the z-axis direction, while a plurality of radiofrequency pulses corresponding to the resonance frequency of the first nucleus, which irradiate the first nucleus, is not emitted. The aspects can also have the steps of: performing slice selection by employing a frequency-selective excitation pulse for any one of a plurality of radiofrequency pulses corresponding to the resonance frequency of the first nucleus, which irradiate the first nucleus, and at the same time when conducting irradiation with the selective excitation pulse, conducting irradiation with a gradient magnetic field pulse in any one of the x-axis direction, the y-axis direction and the z-axis direction; and performing phase encoding to any remaining two directions of the x-axis direction, the y-axis direction and the z-axis direction while a plurality of radiofrequency pulses corresponding to the resonance frequency of the first nucleus, which irradiate the above described first nucleus, are not emitted.

All modes described in the present specification can be appropriately combined with others.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-232656, filed Sep. 7, 2007, which is hereby incorporated by reference herein in its entirety.

The invention claimed is:

1. A nuclear magnetic resonance signal measuring method, comprising the steps of:
providing a sample including (A) a measurement target having an isotope-labeled compound with a first nucleus and at least two nuclei that are different from the first nucleus and that (i) can transmit nuclear magnetic resonance signals, (ii) have mutually different nuclear magnetic resonance frequencies and (iii) are bonded to each other, said compound being isotope-labeled at a higher ratio than a natural isotope abundance ratio, and (B) a non-measurement target having a nuclide of the same type as the first nucleus of the isotope-labeled compound, the nuclide being contained in a compound which is not isotope-labeled;
irradiating to the sample a plurality of pulses generated by a nuclear magnetic resonance apparatus, the nuclear magnetic resonance apparatus having (i) a unit for observing the nuclear magnetic resonance signal of the first nucleus contained in the isotope-labeled compound, which has passed magnetization transfer from the first nucleus to a second nucleus, magnetization transfer from the second nucleus to a third nucleus, magnetization transfer from the third nucleus to the second nucleus, and magnetization transfer from the second nucleus to the first nucleus, among three nuclei comprising said two nuclei, and (ii) a unit for adding positional information to the nuclear magnetic resonance signal of the first nucleus contained in the isotope-labeled compound; and determining with the nuclear magnetic resonance apparatus the nuclear magnetic resonance signal of the first nucleus contained in the isotope-labeled compound the nuclear magnetic resonance signal being generated by irradiating the plurality of pulses, wherein a nuclear magnetic resonance signal of the nuclide contained in said non-measurement target is decreased relative to the nuclear magnetic resonance signal of the first nucleus.

2. The nuclear magnetic resonance signal measuring method according to claim 1, wherein at least two nuclei of the isotope-labeled compound are independently selected from the group consisting of carbon-13, nitrogen-15, oxygen-17, sulphur-33 and combinations thereof.

3. The nuclear magnetic resonance signal measuring method according to claim 2, wherein the first nucleus is selected from the group consisting of hydrogen-1, fluorine-19 and phosphorus-31, and the second and third nuclei are independently selected from the group consisting of carbon-13, nitrogen-15, oxygen-17, sulphur-33 and combinations thereof.

4. The nuclear magnetic resonance signal measuring method according to claim 1, wherein the first nucleus is selected from the group consisting of hydrogen-1, fluorine-19 and phosphorus-31, and the second and third nuclei are independently selected from the group consisting of carbon-13, nitrogen-15, oxygen-17, sulphur-33 and combinations thereof.

5. The nuclear magnetic resonance signal measuring method according to claim 1, wherein the sample is selected from the group consisting of a living body, a living tissue and a living cell.

6. The nuclear magnetic resonance signal measuring method according to claim 5, wherein the isotope-labeled compound has a same chemical structure as a natural substance in the sample.

7. The nuclear magnetic resonance signal measuring method according to claim 4 or 3, wherein the magnetization of the first nucleus is transferred to the second nucleus in a single quantum coherent state, and the magnetization of the second nucleus is transferred to the third nucleus in a single or a multi-quantum coherent state.

8. The nuclear magnetic resonance signal measuring method according to claim 7, further comprising the sequential steps of:

generating a radiofrequency pulse corresponding to a resonance frequency of the first nucleus;

generating, during evolution of a transverse magnetization of the first nucleus, radiofrequency pulses corresponding to respective resonance frequencies of the first nucleus and the second nucleus;

generating radiofrequency pulses corresponding to respective resonance frequencies of the first nucleus and the second nucleus;

generating, during evolution of an anti-phase transverse magnetization of the second nucleus, radiofrequency pulses corresponding to respective resonance frequencies of the second nucleus and the third nucleus;

generating the radiofrequency pulses corresponding to the respective resonance frequencies of the second nucleus and the third nucleus;

generating the radiofrequency pulses corresponding to the respective resonance frequencies of the second nucleus and the third nucleus;

generating, during evolution of the anti-phase transverse magnetization of the second nucleus, the radiofrequency pulses corresponding to the respective resonance frequencies of the second nucleus and the third nucleus;

generating the radiofrequency pulses corresponding to the respective resonance frequencies of the first nucleus and the second nucleus;

generating, during evolution of an anti-phase transverse magnetization of the first nucleus, the radiofrequency pulses corresponding to the respective resonance frequencies of the first nucleus and the second nucleus; and observing an in-phase transverse magnetization of the first nucleus.

9. The nuclear magnetic resonance signal measuring method according to claim 7, further comprising the sequential steps of:

generating a radiofrequency pulse corresponding to a resonance frequency of the first nucleus;

generating, during evolution of a transverse magnetization of the first nucleus, radiofrequency pulses corresponding to respective resonance frequencies of the first nucleus and the second nucleus;

generating radiofrequency pulses corresponding to the respective resonance frequencies of the first nucleus and the second nucleus;

generating radiofrequency pulses corresponding to respective resonance frequencies of the first nucleus and the third nucleus, after having generated a double anti-phase transverse magnetization of the second nucleus;

generating radiofrequency pulses corresponding to the respective resonance frequencies of the first nucleus and the third nucleus;

generating the radiofrequency pulses corresponding to the respective resonance frequencies of the first nucleus and the second nucleus, after having refocused the anti-phase transverse magnetization of the second nucleus;

generating, during evolution of an anti-phase transverse magnetization of the first nucleus, the radiofrequency pulses corresponding to the respective resonance frequencies of the first nucleus and the second nucleus; and observing a generated in-phase transverse magnetization of the first nucleus.

10. The nuclear magnetic resonance signal measuring method according to claim 9, further comprising the steps of:

generating the radiofrequency pulses corresponding to the respective resonance frequencies of the first nucleus and the third nucleus, during evolution of the anti-phase transverse magnetization of the second nucleus, after the step of generating radiofrequency pulses corresponding to the respective resonance frequencies of the first nucleus and the second nucleus; and generating the radiofrequency pulses corresponding to the respective resonance frequencies of the first nucleus and the second nucleus, during evolution of a transverse magnetization of the third nucleus, after the step of generating radiofrequency pulses corresponding to the respective resonance frequencies of the first nucleus and the third nucleus, after generating the double anti-phase transverse magnetization of the second nucleus.

11. The nuclear magnetic resonance signal measuring method according to claim 7, further comprising the sequential steps of:

generating a radiofrequency pulse corresponding to a resonance frequency of the first nucleus;

generating, during evolution of a transverse magnetization of the first nucleus, radiofrequency pulses corresponding to respective resonance frequencies of the first nucleus and the second nucleus;

generating the radiofrequency pulses corresponding to the respective resonance frequencies of the first nucleus and the second nucleus;

generating, during evolution of an anti-phase transverse magnetization of the second nucleus, the radiofrequency pulses corresponding to the respective resonance frequencies of the first nucleus, the second nucleus, and third nucleus;

generating a first spinlock pulse which generates cross-polarization between the second nucleus and the third nucleus;

generating a first radiofrequency pulse corresponding to a resonance frequency of the third nucleus;

generating a second radiofrequency pulse corresponding to a resonance frequency of the third nucleus;

generating a second spinlock pulse which generates cross-polarization between the second nucleus and the third nucleus;

generating, during evolution of the anti-phase transverse magnetization of the second nucleus, the radiofrequency pulses corresponding to the respective resonance frequencies of the first nucleus, the second nucleus, and the third nucleus;

generating the radiofrequency pulses corresponding to the respective resonance frequencies of the first nucleus and the second nucleus;

generating, during evolution of an anti-phase transverse magnetization of the first nucleus, the radiofrequency pulses corresponding to the respective resonance frequencies of the first nucleus and the second nucleus; and observing a generated in-phase transverse magnetization of the first nucleus.

12. The nuclear magnetic resonance signal measuring method according to claim 11, further comprising the step of generating a gradient magnetic field pulse, in between the step of (i) generating a first radiofrequency pulse corresponding to a resonance frequency of the third nucleus and the step of (ii) generating a second radiofrequency pulse corresponding to a resonance frequency of the third nucleus.

13. The nuclear magnetic resonance signal measuring method according to claim 12, further comprising the steps of:

generating a radiofrequency pulse for exciting water; and conducting irradiation with a gradient magnetic field pulse that cancels a signal of water.

14. The nuclear magnetic resonance signal measuring method according to claim 13, further comprising the step of generating a gradient magnetic field pulse that attains coherence selection.

15. The nuclear magnetic resonance signal measuring method according to claim 14, wherein at least one radiofrequency pulse corresponding to a resonance frequency of the second nucleus is a frequency-selective excitation pulse.

16. The nuclear magnetic resonance signal measuring method according to claim 15, further comprising the steps of:

generating a frequency-selective excitation pulse for any three of a plurality of radiofrequency pulses corresponding to the resonance frequency of the first nucleus, and generating gradient magnetic field pulses in each of an x-axis direction, a y-axis direction and a z-axis direction, while the frequency-selective excitation pulses are generated.

17. The nuclear magnetic resonance signal measuring method according to claim 16, which further performs phase encoding to two directions among an x-axis direction, a y-axis direction and a z-axis direction, while the plurality of radiofrequency pulses corresponding to the resonance frequency of the first nucleus are not generated.

18. The nuclear magnetic resonance signal measuring method according to claim 15, further comprising the steps of:

generating the frequency-selective excitation pulse for any one of a plurality of radiofrequency pulses corresponding to a resonance frequency of the first nucleus;

generating a gradient magnetic field pulse in one direction among an x-axis direction, a y-axis direction and a z-axis direction, while the frequency-selective excitation pulse is generated; and performing phase encoding to two remaining directions among the x-axis, y-axis and z-axis directions, while the plurality of radiofrequency pulses corresponding to the resonance frequency of the first nucleus are not generated.

* * * * *